US009823291B2

(12) United States Patent
Shikibu et al.

(10) Patent No.: US 9,823,291 B2
(45) Date of Patent: Nov. 21, 2017

(54) SEMICONDUCTOR DEVICE AND METHOD OF TESTING SEMICONDUCTOR DEVICE

(71) Applicant: FUJITSU LIMITED, Kawasaki-shi, Kanagawa (JP)

(72) Inventors: Takahiro Shikibu, Kawasaki (JP); Tatsumi Nakada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 219 days.

(21) Appl. No.: 14/810,831

(22) Filed: Jul. 28, 2015

(65) Prior Publication Data
US 2016/0043029 A1  Feb. 11, 2016

(30) Foreign Application Priority Data

Aug. 11, 2014  (JP) ................. 2014-163764

(51) Int. Cl.
*G01R 31/26* (2014.01)
*G01R 31/28* (2006.01)
(Continued)

(52) U.S. Cl.
CPC ......... *G01R 31/26* (2013.01); *G01R 31/2853* (2013.01); *H01L 22/22* (2013.01); *H01L 23/5382* (2013.01); *G01R 31/2856* (2013.01); *H01L 24/16* (2013.01); *H01L 25/0655* (2013.01); *H01L 25/0657* (2013.01); *H01L 2224/0401* (2013.01); *H01L 2224/16145* (2013.01); *H01L 2225/06513* (2013.01);
(Continued)

(58) Field of Classification Search
None
See application file for complete search history.

(56) References Cited

U.S. PATENT DOCUMENTS

2006/0001176 A1* 1/2006 Fukaishi ............. G11C 5/02
257/777
2007/0132085 A1   6/2007 Shibata et al.
(Continued)

FOREIGN PATENT DOCUMENTS

EP    2 610 900 A2    7/2013
JP    2007-158237     6/2007
(Continued)

OTHER PUBLICATIONS

Extended European Search Report dated Dec. 10, 2015 in corresponding European Patent Application No. 15179023.5.

Primary Examiner — Lex Malsawma
(74) Attorney, Agent, or Firm — Staas & Halsey LLP

(57) ABSTRACT

A semiconductor device includes: a plurality of semiconductor chips; and a connecting portion that connects a plurality of terminals formed on the plurality of semiconductor chips, wherein the plurality of terminals of the plurality of semiconductor chips belong to one of first group or second group, an interval between one of first terminals belonging to the first group and one of second terminals belonging to the second group is a predetermined interval, the one of the second terminals being adjacent to the one of the first terminal, the first terminals are arranged at an interval larger than the predetermined interval, and each of the plurality of semiconductor chips includes a selecting portion that selects a signal transmitting terminal among the plurality of terminals, per each of the groups.

5 Claims, 10 Drawing Sheets

(51) Int. Cl.
  *H01L 21/66* (2006.01)
  *H01L 23/538* (2006.01)
  H01L 25/065 (2006.01)
  H01L 23/00 (2006.01)

(52) U.S. Cl.
  CPC .............. *H01L 2225/06541* (2013.01); *H01L 2225/06596* (2013.01)

(56) References Cited

U.S. PATENT DOCUMENTS

| | | |
|---|---|---|
| 2011/0309359 A1 | 12/2011 | Saen et al. |
| 2013/0153899 A1 | 6/2013 | Wada et al. |
| 2014/0167278 A1* | 6/2014 | Crisp ........................ G11C 5/04 257/773 |
| 2015/0084689 A1 | 3/2015 | Lee et al. |

FOREIGN PATENT DOCUMENTS

| | | |
|---|---|---|
| JP | 2013-131534 | 7/2013 |
| WO | WO 2010/097947 A1 | 9/2010 |

\* cited by examiner

US 9,823,291 B2

SEMICONDUCTOR DEVICE AND METHOD OF TESTING SEMICONDUCTOR DEVICE

CROSS-REFERENCE TO RELATED APPLICATION

This application is based upon and claims the benefit of priority of the prior Japanese Patent Application No. 2014-163764 filed on Aug. 11, 2014, the entire contents of which are incorporated herein by reference.

FIELD

The embodiments discussed herein are related to a semiconductor device and a method of testing the semiconductor device.

BACKGROUND

In a System in Package (SiP), a plurality of semiconductor chips are stored in a single package. For example, there has been proposed a semiconductor device in which the plurality of semiconductor chips are stacked up. In addition, the plurality of semiconductor chips may be arranged side by side in a lateral direction. The Input/Output (I/O) terminals of the plurality of semiconductor chips are joined together by bumps such as micro-bumps, for example. Since the micro-bumps allow the I/O terminals arranged at an interval smaller than the conventional I/O terminals to be joined together, it is possible to make a bus width of data transmitted between the semiconductor chips wider than the conventional bus width. Therefore, the semiconductor chips joined by the micro-bumps may realize a transmission speed higher than the conventional semiconductor chips.

Meanwhile, if a large number of I/O terminals are arranged, there is a possibility that a failure occurs in the wirings including the I/O terminals and the micro-bumps, due to the defective manufacture of the micro-bumps. For example, a failure may occur in which the wirings including the I/O terminals and the micro-bumps are opened or neighboring wirings may short-circuits.

In addition, if the interval between the I/O terminals is smaller than the convention I/O terminals, a test for the surroundings of the I/O terminals is sometimes carried out after the assembly (packaging) of the SiP, because it is difficult to carry out the test with the semiconductor chips themselves. Further, a reduction in a yield resulting from the defective joining by the micro-bumps becomes a big factor that incurs a high cost for the SiP.

Therefore, for example, a technology to detour a defective portion has been proposed in the semiconductor device in which the plurality of semiconductor chips is stacked up. Such a type of semiconductor device includes a spare signal path (hereinafter referred to also as a redundant wiring) and a redundant circuit changing the spare signal path. For instance, if one of a plurality of signal paths between the semiconductor chips develops a failure for several reasons such as a disconnecting portion, the spare signal path is used.

When any one of the signal paths between the semiconductor chips develops a failure due to short-circuits between the neighboring wirings, it is impossible to resolve the failure of the signal path between the semiconductor chips by the redundant wiring of one line. For example, if the short-circuit occurs between the neighboring wirings, the failure of the signal path between the semiconductor chips is resolved by using a redundant wiring of two lines instead of a wiring of two lines that causes a short-circuit. The detour of the defective portion using the redundant wirings of two or more lines leads to an increase in scale of the redundant circuit including, for example, a selector for selecting a wiring that is to be used.

The following is reference documents:
[Document 1] Japanese Laid-Open Patent Publication No. 2013-131534,
[Document 2] Japanese Laid-Open Patent Publication No. 2007-158237, and
[Document 3] International Publication Pamphlet No. WO 2010-097947.

SUMMARY

According to an aspect of the invention, a semiconductor device includes: a plurality of semiconductor chips; and a connecting portion that connects a plurality of terminals formed on the plurality of semiconductor chips, wherein the plurality of terminals of the plurality of semiconductor chips belong to one of first group or second group, an interval between one of first terminals belonging to the first group and one of second terminals belonging to the second group is a predetermined interval, the one of the second terminals being adjacent to the one of the first terminal, the first terminals are arranged at an interval larger than the predetermined interval, and each of the plurality of semiconductor chips includes a selecting portion that selects a signal transmitting terminal among the plurality of terminals, per each of the groups.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, exemplary embodiments of the present invention will be described with reference to the drawings.

Figure 1:
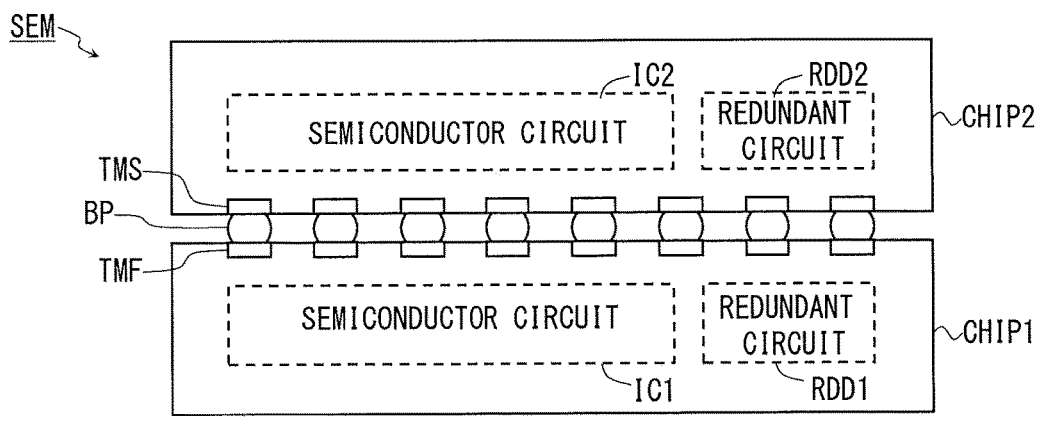
FIG. 1 is a view illustrating an embodiment of a semiconductor device and a method of testing the semiconductor device.

FIG. 1 illustrates an embodiment of a semiconductor device and a method of testing the semiconductor device. Further, FIG. 1 is a view of the semiconductor device SEM when seen from a side. The semiconductor device SEM is a SiP in which a plurality of semiconductor chips is stored in a single package. For example, the semiconductor device SEM includes the plurality of semiconductor chips and bumps BP connecting a plurality of terminals TMF and TMS arranged on a predetermined surface of each of the semiconductor chips with each other. The terminals TMF and TMS are terminals of the respective semiconductor chips, such as an I/O terminal used to transmit data between the semiconductor chips 1 and 2. Meanwhile, for the purpose of clarity, for example, a package substrate and a terminal connected to the package substrate are omitted in FIG. 1.

Each semiconductor chip includes circuits IC (IC1, IC2), redundant circuits RDD (RDD1, RDD2), and terminals TMF and TMS classified into a plurality of groups. Since the circuits IC (IC1, IC2) and the redundant circuits RDD (RDD1, RDD2) include a plurality of semiconductor elements, these elements are illustrated in FIG. 1 by a box of a dashed line.

The circuit IC is, for example, an integrated circuit for implementing the function of the semiconductor device SEM. Further, in the testing method of the semiconductor device SEM, a test circuit (e.g., a test circuit TCNT1 illustrated in FIG. 3) included in the redundant circuit RDD1 is controlled by a testing device for testing the semiconductor device SEM. That is, the testing device for testing the semiconductor device SEM is configured to control the test circuit (e.g., the test circuit TCNT1 illustrated in FIG. 3) included in the redundant circuit RDD1, thus testing the semiconductor device SEM. The semiconductor device SEM testing method will be described with reference to FIGS. 5 and 6.

The plurality of groups has a plurality of first groups (hereinafter referred to as a redundant group) to which redundant terminals TMF and TMS belong. Each redundant group includes at least one group of the redundant terminals TMF and TMS (e.g., spare terminals TMF and TMS). The redundant group will be described with reference to FIGS. 2 and 3.

For example, the terminals TMF and TMS belong to either of a plurality of redundant groups that may evade a defective portion of a signal path between the semiconductor chips 1 and 2, or groups other than the redundant groups. The terminals TMF and TMS (groups of the corresponding terminals TMF and TMS) connected to each other are included in the signal path between the semiconductor chips 1 and 2.

The plurality of terminals TMF are arranged on a surface (e.g., a surface on which the circuit IC1 is formed) of the semiconductor chip 1, to be connected to the circuit IC1 or the redundant circuit RDD1. Further, the plurality of terminals TMS are arranged on a surface (e.g., a surface on which the circuit IC2 is formed) of the semiconductor chip 2, to be connected to the circuit IC2 or the redundant circuit RDD2.

The terminals TMF of the semiconductor chip 1 are electrically connected to the terminal TMS of the semiconductor chip 2 via the bumps BP such as the micro-bumps. As such, the bumps BP electrically connect the terminals TMF and TMS of the different semiconductor chips to each other. That is, the bumps BP are an example of a connecting portion for connecting the plurality of terminals TMF and TMS, arranged on the predetermined surfaces of the plurality of semiconductor chips, to each other. In the example of FIG. 1, the semiconductor chips 1 and 2 are joined together such that the surface of the semiconductor chip 1 (e.g., the surface on which the circuit IC1 is formed) faces the surface of the semiconductor chip 2 (e.g., the surface on which the circuit IC2 is formed).

The redundant circuits RDD1 and RDD2 are an example of a selecting portion for selecting a signal transmitting terminal TMF, TMS per redundant group from the plurality of terminals TMF and TMS. For example, the redundant circuits RDD1 and RDD2 set a signal path (e.g., a signal path including the terminals TMF and TMS connected to each other via the bumps BP) which is used to transmit data between the semiconductor chips 1 and 2, per redundant group. The configuration of the redundant circuits RDD1 and RDD2 will be described with reference to FIGS. 3 and 4.

Meanwhile, the configuration of the semiconductor device SEM is not limited to the above-described example. For example, the semiconductor chips 1 and 2 may be joined together such that a back surface of the semiconductor chip 1 (e.g., a surface opposite to the surface on which the circuit IC1 is formed) faces the surface of the semiconductor chip 2 (e.g., the surface on which the circuit IC2 is formed). In this case, the semiconductor chip 1 includes a penetration electrode penetrating the semiconductor chip 1. A terminal on a back surface of the penetration electrode formed on the semiconductor chip 1 is electrically connected to the terminal TMS of the semiconductor chip 2 via, for example, the bumps BR Thus, the terminal on the surface of the penetration electrode formed on the semiconductor chip 1 is electrically connected to the terminal TMS of the semiconductor chip 2 via, for example, the penetration electrode and the bumps BP.

When the terminal on the back surface of the penetration electrode is defined as the plurality of terminals TMF arranged on a predetermined surface of the semiconductor chip 1, the bump BP connecting the terminal on the back surface of the penetration electrode with the terminal TMS is an example of the connecting portion which connects the terminals TMF and TMS of the plurality of semiconductor chips with each other. Further, when the terminal on the surface of the penetration electrode is defined as the plurality of terminals TMF arranged on a predetermined surface of the semiconductor chip 1, the wiring including the penetration electrode and the bump BP is an example of the connecting portion which connects the terminals TMF and TMS of the plurality of semiconductor chips with each other.

Alternatively, the semiconductor device SEM may have three or more semiconductor chips which are mounted in three dimensions. Further, the semiconductor device SEM may have a plurality of semiconductor chips that are arranged on the package substrate side by side in rows.

Figure 2:
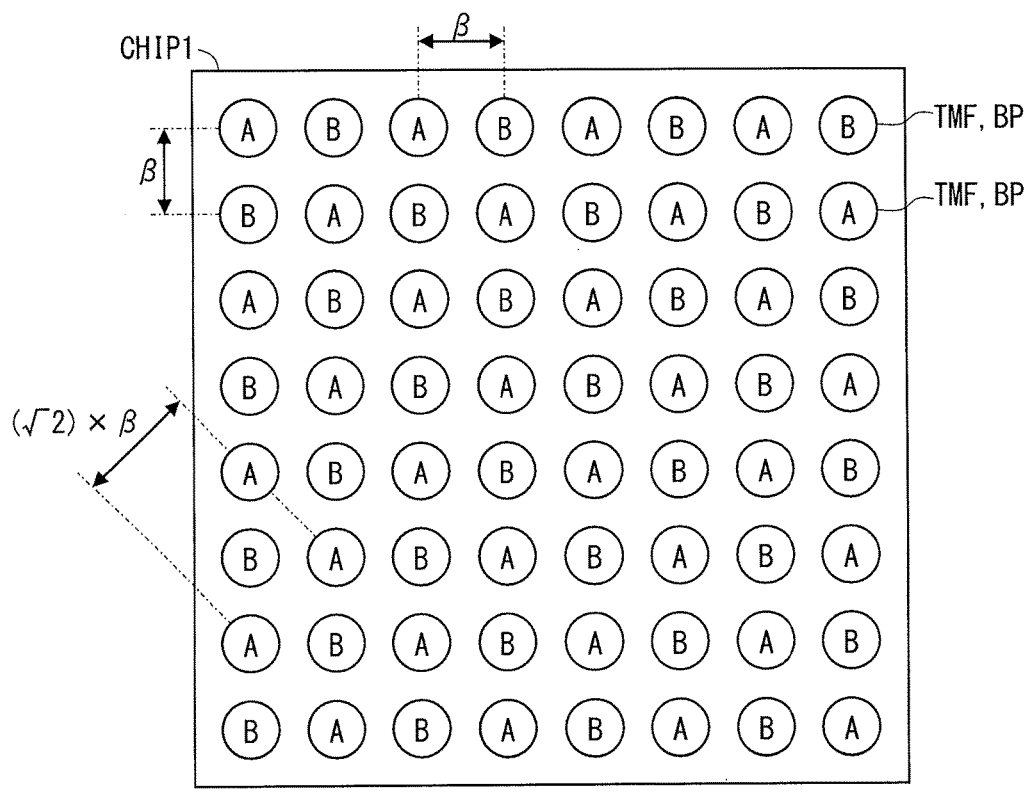
FIG. 2 is a view illustrating an example of a terminal arrangement of the semiconductor chip illustrated in FIG. 1.

FIG. 2 is a view illustrating an example of the terminal arrangement of the semiconductor chip 1 illustrated in FIG. 1. Also, FIG. 2 shows the surface of the semiconductor chip 1. In FIG. 2, the arrangement of the terminals TMF belonging to the redundant group is mainly illustrated. In addition, the bumps BP connecting the terminals TMF to the terminals TMS of the semiconductor chip 2 are also arranged equally or similarly to the terminals TMF. For example, the arrangement of the terminals TMS of the semiconductor chip 2 is equal or similar to the arrangement obtained by laterally reversing the terminal arrangement of FIG. 2. Reference characters A and B of FIG. 2 designate the redundant groups A and B. That is, in the example of FIG. 2, there are two redundant groups. However, there may be three or more redundant groups.

The terminals TMF are arranged on the surface of the semiconductor chip 1 such that an interval between neighboring terminals TMF is equal to or larger than a predetermined interval β. For example, the terminals TMF are arranged in a lattice form. Both a lateral interval and a longitudinal interval of the terminals TMF arranged in the lattice form are the predetermined interval β. Meanwhile, the terminals TMF belonging to one of the plurality of redundant groups are arranged in an interval larger than the predetermined interval β. That is, in at least one of the plurality of redundant groups, the terminals TMF belonging to the same redundant group are arranged in an interval larger than the predetermined interval β. For example, the terminals TMF belonging to the redundant group A and the terminals TMF belonging to the redundant group B are alternately arranged in the lateral direction as well as the longitudinal direction of FIG. 2.

In this case, an interval between adjacent terminals TMF in an oblique direction of FIG. 2 is expressed by $(\sqrt{2}) \times \beta$, and the interval is larger than the predetermined interval β. As such, the terminals TMF belonging to the redundant group A are arranged in the interval that is larger than the predetermined interval β. Further, the terminals TMF belonging to the redundant group B are arranged in the interval that is larger than the predetermined interval β. Thus, in the semiconductor device SEM, it is possible to reduce a probability that short-circuits occurs between the terminals TMF belonging to the same redundant group, as compared to the arrangement in which the terminals TMF belonging to the same redundant group are arranged in the predetermined interval β.

Figure 10:
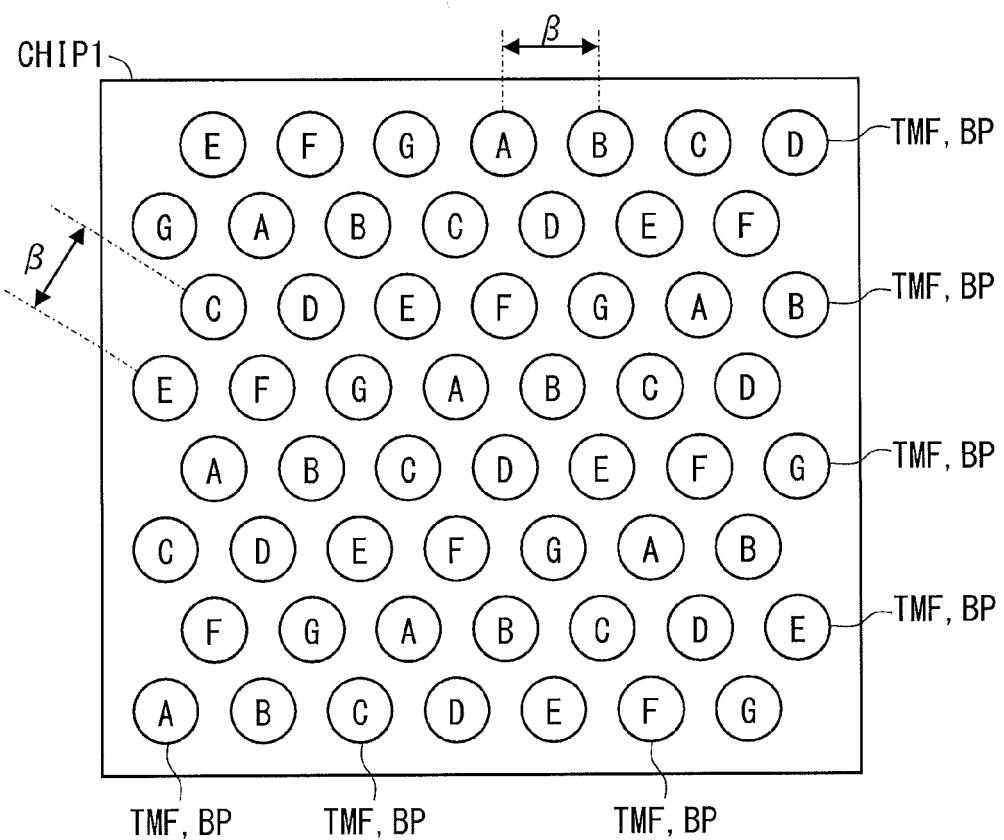
FIG. 10 is a view illustrating still another example of the terminal arrangement of the semiconductor chip illustrated in FIG. 1.

Meanwhile, the terminal arrangement of the semiconductor chip 1 is not limited to the example described above. For example, if the redundant groups are three or more, the terminals TMF may be arranged in a zig-zag fashion, as illustrated in FIG. 10.

Figure 3:
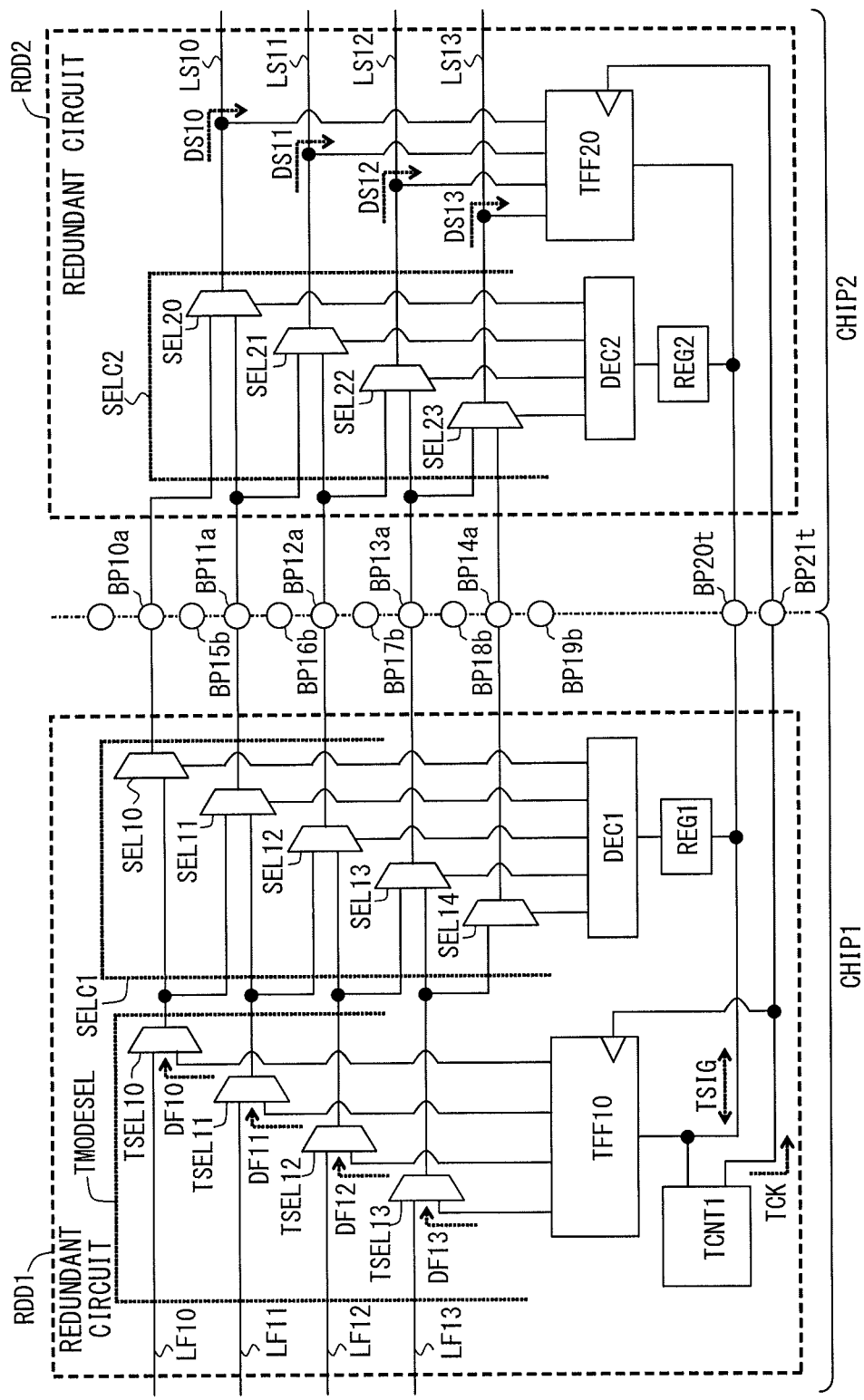
FIG. 3 is a view illustrating an example of a redundant circuit illustrated in FIG. 1.

FIG. 3 is a view illustrating an example of the redundant circuits RDD1 and RDD2 illustrated in FIG. 1. An arrow illustrated by a dashed line in FIG. 3 shows an example of a signal flow. Further, the suffixes a, b and t of the reference characters, such as, for example, BP10a, BP15b, BP20t, of the bumps BP illustrate that the bumps BP belong to the redundant groups A and B and a group T, respectively. The group T is a group to which the non-redundant terminals TMF and TMS belong, and is one of groups other than the redundant group.

For the purpose of clarity, the number of bumps BP belonging to the redundant groups A and B in FIG. 3 is illustrated to be smaller than that of the bumps BP belonging to the redundant groups A and B in FIG. 2. In the example of FIG. 3, the number of the bumps BP belonging to the redundant group A is 5. Further, the description of, for example, the terminals TMF and TMS connected to each other by the bumps BP is omitted in FIG. 3.

The redundant circuit RDD1 includes a test circuit TCNT1, a flip-flop part TFF10 for a test, a register REG1, a decoder DEC1, and selection circuits SELC1 and TMODESEL. The flip-flop part TFF10, the register REG1, the decoder DEC1 and the selection circuits SELC1 and TMODESEL are provided to correspond to each of the redundant groups, for example. Descriptions for the flip-flop part TFF10, the register REG1, the decoder DEC1, and the selection circuits SELC1 and TMODESEL, which correspond to the redundant group (e.g., the redundant group B) except the redundant group A, are omitted in FIG. 3.

The test circuit TCNT1 is controlled from an exterior (e.g., a testing device) of the semiconductor device SEM via, for example, the test terminal of the semiconductor device SEM, thus performing a testing of the semiconductor device SEM. For example, in a test for connection between the semiconductor chips 1 and 2, the test circuit TCNT1 tests whether a signal path including the terminals TMF and TMS connected to each other by the bumps BP has a failure.

The test circuit TCNT1 outputs a clock for a test TCK to the flip-flop part TFF10 and the flip-flop part TFF20 of the redundant circuit RDD2. Further, the test circuit TCNT1 transceives a signal TSIG for the test, such as test data or test results, between the register REG1, the flip-flop part TFF10, the register REG2 of the redundant circuit RDD2 and the flip-flop part TFF20.

The flip-flop part TFF10 includes, for example, a flip-flop to maintain each piece of test data DF10 to DF13. For instance, the flip-flop part TFF10 receives the signal TSIG and the clock TCK, indicating test data DF10 to DF13, during a test, thus maintaining the test data DF10 to DF13. Further, the flip-flop part TFF10 synchronizes the test data DF10 to DF13 with the clock TCK, and then outputs the test data to the selection circuit SELC1 through the selection circuit TMODESEL.

For example, the selection circuit TMODESEL includes selectors TSEL10 to TSEL13. Further, each selector TSEL10 to TSEL13 outputs any one of a signal transmitted to each of signal lines LF10 to LF13 of a circuit IC1 and the test data DF10 to DF13 to the selection circuit SELC1, as the signal of each of the signal lines LF10 to LF13. The selection circuit TMODESEL is set to select the test data DF10 to DF13 during the test. Hereinafter, the signal line connected to an output of each of the selectors TSEL10 to TSEL13 is also referred to as the signal line LF10 to LF13.

The register REG1 includes a flip-flop to maintain information indicating a detouring signal path, and outputs the information indicating the detouring signal path to the decoder DEC1. For example, the register REG1 receives a signal TSIG indicating the detouring signal path from the test circuit TCNT1.

The decoder DEC1 generates a selecting signal of each of the selectors SEL10 to SEL14 of the selection circuit SELC1, based on information (information indicating the detouring the signal path) received from the register REG1.

The selection circuit SELC1 selects a signal path that is used to transmit data between the semiconductor chips 1 and 2. The selection circuit SELC1 selects four bumps BP that are electrically connected to four lines of the circuit IC1, namely, signal lines LF10, LF11, LF12 and LF13, respectively, among five bumps BP10a, BP11a, BP12a, BP13a and BP14a. That is, the selection circuit SELC1 selects four bumps BP that are used for the signal paths between the signal lines LF10 to LF13 which are four lines of the circuit IC1 and the signal lines LS10 to LS13 which are four lines of the circuit IC2, among five bumps BP10a to BP14a. For example, the selection circuit SELC1 includes selectors SEL10 to SEL14.

One of the two input terminals of the selector SEL10 is connected to an output of the selector TSEL10, while the other of the two input terminals is in an open state. That is, one of the two input terminals of the selector SEL10 is connected via the selector TSEL10 to the signal line LF10. Thus, the selector SEL10 receives a signal (e.g., test data DF10 in the case of the test) transmitted to the signal line LF10. Further, the selector SEL10 receives a selecting signal from the decoder DEC1. Furthermore, the selector SEL10 electrically connects the signal line LF10 to the bump BP10a, based on the selecting signal from the decoder DEC1.

Meanwhile, when the selecting signal from the decoder DEC1 indicates a non-selection of the bump BP10a, the selector SEL10 causes the signal line LF10 and the bump BP10a to be in an electrically non-connection state. As such, the selector SEL10 outputs the signal transmitted to the signal line LF10 to the bump BP10a, based on the selecting signal from the decoder DEC1. The selector SEL10 may be a switch that converts a state from a conductive state to a non-conductive state, and vice versa.

The two input terminals of the selector SEL11 are connected to the outputs of the selectors TSEL10 and TSEL11, respectively. That is, the two input terminals of the selector SEL11 are connected via the selectors TSEL10 and TSEL11 to the signal lines LF10 and LF11, respectively. Thus, the selector SEL11 receives a signal (e.g., the test data DF10 in the case of the test) transmitted to the signal line LF10 and a signal (e.g., the test data DF11 in the case of the test) transmitted to the signal line LF11. Further, the selector SEL11 receives the selecting signal from the decoder DEC1. Moreover, the selector SEL11 electrically connects either of the signal lines LF10 and LF11 to the bump BP11a, based on the selecting signal from the decoder DEC1. That is, the selector SEL11 outputs either one of the signal transmitted to the signal line LF10 and the signal transmitted to the signal line LF11 to the bump BP11a, based on the selecting signal from the decoder DEC1.

The two input terminals of the selector SEL12 are connected to the outputs of the selectors TSEL11 and TSEL12, respectively. That is, the two input terminals of the selector SEL12 are connected, respectively, to the signal lines LF11 and LF12 via the selectors TSEL11 and TSEL12. Thus, the selector SEL12 receives a signal (e.g., the test data DF11 in the case of the test) transmitted to the signal line LF11 and a signal (e.g., the test data DF12 in the case of the test) transmitted to the signal line LF12. Further, the selector SEL12 receives the selecting signal from the decoder DEC1. Moreover, the selector SEL12 electrically connects either one of the signal lines LF11 and LF12 to the bump BP12a, based on the selecting signal from the decoder DEC1. That is, the selector SEL12 outputs either one of the signal transmitted to the signal line LF11 and the signal transmitted to the signal line LF12 to the bump BP11a, based on the selecting signal from the decoder DEC1.

The two input terminals of the selector SEL13 are connected to the outputs of the selectors TSEL12 and TSEL13, respectively. That is, the two input terminals of the selector SEL13 are connected, respectively, to the signal lines LF12 and LF13 via the selectors TSEL12 and TSEL13. Thus, the selector SEL13 receives a signal (e.g., the test data DF12 in the case of the test) transmitted to the signal line LF12 and a signal (e.g., the test data DF13 in the case of the test) transmitted to the signal line LF13. Further, the selector SEL13 receives the selecting signal from the decoder DEC1. Moreover, the selector SEL13 electrically connects either one of the signal lines LF12 and LF13 to the bump BP13a, based on the selecting signal from the decoder DEC1. That is, the selector SEL13 outputs either one of the signal transmitted to the signal line LF12 and the signal transmitted to the signal line LF13 to the bump BP13a, based on the selecting signal from the decoder DEC1.

One of the two input terminals of the selector SEL14 is connected to an output of the selector TSEL13, while the other of the two input terminals is in an open state. That is, one of the two input terminals of the selector SEL14 is connected via the selector TSEL13 to the signal line LF13. Thus, the selector SEL14 receives a signal (e.g., test data DF13 in the case of the test) transmitted to the signal line LF13. Further, the selector SEL14 receives a selecting signal from the decoder DEC1. Furthermore, the selector SEL14 electrically connects the signal line LF13 to the bump BP14a, based on the selecting signal from the decoder DEC1.

Meanwhile, when the selecting signal from the decoder DEC1 indicates a non-selection of the bump BP14a, the selector SEL14 causes the signal line LF13 and the bump BP14a to be in an electrically non-connection state. As such, the selector SEL14 outputs the signal transmitted to the signal line LF13 to the bump BP14a, based on the selecting signal from the decoder DEC1. The selector SEL14 may be a switch that converts a state from a conductive state to a non-conductive state, and vice versa.

The redundant circuit RDD2 includes a register REG2, a decoder DEC2, a selection circuit SELC2, and a flip-flop part TFF20 for a test. The register REG2, the decoder DEC2, the selection circuit SELC2, and the flip-flop part TFF20 for the test are provided to correspond, for example, to each of the redundant groups. Descriptions for the register REG2, the decoder DEC2, the selection circuit SELC2, and the flip-flop part TFF20 for the test, which correspond to the redundant group (e.g., the redundant group B) except the redundant group A, are omitted in FIG. 3.

The register REG2 includes a flip-flop to maintain information indicating a detouring signal path, and outputs the information indicating the detouring signal path to the decoder DEC2. For example, the register REG2 receives a signal TSIG indicating the detouring signal path from the test circuit TCNT1 through a bump BP20t.

The decoder DEC2 generates a selecting signal of each of the selectors SEL20 to SEL23 of the selection circuit SELC2, based on information (information indicating the detouring the signal path) received from the register REG2.

The selection circuit SELC2 selects a signal path that is used to transmit data between the semiconductor chips 1 and 2. The selection circuit SELC2 selects four bumps BP that are electrically connected to four lines of the circuit IC2, namely, signal lines LS10, LS11, LS12 and LS13, respectively, among five bumps BP10a, BP11a, BP12a, BP13a and BP14a. That is, the selection circuit SELC2 selects four bumps BP that are used for the signal paths between the signal lines LF10 to LF13 which are four lines of the circuit IC1 and the signal lines LS10 to LS13 which are four lines of the circuit IC2, among five bumps BP10a to BP14a. For example, the selection circuit SELC2 includes selectors SEL20 to SEL23.

The two input terminals of the selector SEL20 are electrically connected to the bumps BP10a and BP11a, respectively. Thus, the selector SEL20 receives a signal transmitted from the semiconductor chip 1 through the bump 10a and a signal transmitted from the semiconductor chip 1 through the bump 11a. Further, the selector SEL20 receives the selecting signal from the decoder DEC2. Moreover, the selector SEL20 electrically connects either one of the bumps BP10a and BP11a to the signal line LS10, based on the selecting signal from the decoder DEC2. That is, the selector SEL20 outputs either one of the signal transmitted from the semiconductor chip 1 through the bump 10a and the signal transmitted from the semiconductor chip 1 through the bump 11a, to the signal line LS10, based on the selecting signal from the decoder DEC2.

The two input terminals of the selector SEL21 are electrically connected to the bumps BP11a and BP12a, respectively. Thus, the selector SEL21 receives a signal transmitted from the semiconductor chip 1 through the bump 11a and a signal transmitted from the semiconductor chip 1 through the bump 12a. Further, the selector SEL21 receives the selecting signal from the decoder DEC2. Moreover, the selector SEL21 electrically connects either one of the bumps BP11a and BP12a to the signal line LS11, based on the selecting signal from the decoder DEC2. That is, the selector SEL21 outputs either one of the signal transmitted from the semiconductor chip 1 through the bump 11a and the signal transmitted from the semiconductor chip 1 through the bump 12a, to the signal line LS11, based on the selecting signal from the decoder DEC2.

The two input terminals of the selector SEL22 are electrically connected to the bumps BP12a and BP13a, respectively. Thus, the selector SEL22 receives a signal transmitted from the semiconductor chip 1 through the bump 12a and a signal transmitted from the semiconductor chip 1 through the bump 13a. Further, the selector SEL22 receives the selecting signal from the decoder DEC2. Moreover, the selector SEL22 electrically connects either one of the bumps BP12a and BP13a to the signal line LS11, based on the selecting signal from the decoder DEC2. That is, the selector SEL22 outputs either one of the signal transmitted from the semiconductor chip 1 through the bump 12a and the signal transmitted from the semiconductor chip 1 through the bump 13a, to the signal line LS12, based on the selecting signal from the decoder DEC2.

The two input terminals of the selector SEL23 are electrically connected to the bumps BP13a and BP14a, respectively. Thus, the selector SEL23 receives a signal transmitted from the semiconductor chip 1 through the bump 13a and a signal transmitted from the semiconductor chip 1 through the bump 14a. Further, the selector SEL23 receives the selecting signal from the decoder DEC2. Moreover, the selector SEL23 electrically connects either one of the bumps BP13a and BP14a to the signal line LS13, based on the selecting signal from the decoder DEC2. That is, the selector SEL23 outputs either one of the signal transmitted from the semiconductor chip 1 through the bump 13a and the signal transmitted from the semiconductor chip 1 through the bump 14a, to the signal line LS13, based on the selecting signal from the decoder DEC2.

The flip-flop part TFF20 includes, for example, a flip-flop to maintain each piece of test data DS10 to DS13. For instance, the flip-flop part TFF20 receives the test data DS10 to DS13 from the respective selectors SEL20 to SEL23, and receives the clock TCK from the test circuit TCNT1 through the bump BP21t, during a test. As a result, the flip-flop part TFF20 maintains the test data DS10 to DS13. Further, the flip-flop part TFF20 synchronizes a signal TSIG indicating the test data DS10 to DS13 with the clock TCK, and then outputs the signal TSIG to the test circuit TCNT1 through the bump BP20t.

Meanwhile, the test data DS10 to DS13 correspond to the test data DF10 to DF13, respectively. For example, if there is no failure in the signal path used to transmit data between the semiconductor chips 1 and 2, the test data DS10 to DS13 coincides with the test data DF10 to DF13.

Here, for example, if the bumps BP12a and BP16b cause a short-circuit, the selection circuit SELC (SELC1 and SELC2) corresponding to the redundant group A selects the bumps BP10a, BP11a, BP13a and BP14a other than the bump BP12a. That is, the signal line LF10 in the semiconductor chip 1 is electrically connected to the signal line LS10 in the semiconductor chip 2, via the selector SEL10, the bump BP10a and the selector SEL20. The signal line LF11 in the semiconductor chip 1 is electrically connected to the signal line LS11 in the semiconductor chip 2, via the selector SEL11, the bump BP11a and the selector SEL21.

The signal line LF12 in the semiconductor chip 1 is electrically connected to the signal line LS12 in the semiconductor chip 2, via the selector SEL13, the bump BP13a and the selector SEL22. The signal line LF13 in the semiconductor chip 1 is electrically connected to the signal line LS13 in the semiconductor chip 2, via the selector SEL14, the bump BP14a and the selector SEL23.

Meanwhile, the selection circuit SELC corresponding to the redundant group B selects the bumps BP15b, BP17b, BP18b and BP19b other than the bump BP16b. As a result, the semiconductor device SEM may relieve the signal path between the semiconductor chips 1 and 2, even if neighboring wirings (e.g., the bumps BP12a and BP16b) cause short-circuits. As such, the redundant circuit RDD (RDD1 and RDD2) selects the terminals TMF and TMS used to transmit data between the semiconductor chips 1 and 2, based on the test result, per redundant group, in the case of detouring a defective signal path.

Further, since, in this embodiment, a plurality of signal paths are divided into a plurality of redundant groups, it is possible to suppress an increase in circuit scale. For example, when spare signal paths of k lines are established for signal paths of n lines, each semiconductor chip includes n (k+1):1 selectors (the selector of one output for (k+1) inputs). Assuming that two spare signal paths are established for eight signal paths (n=8, k=2), a chip corresponding to the semiconductor chip 2 includes eight 3:1 selectors (the selector of one output for three inputs). Further, the chip corresponding to the semiconductor chip 1 includes ten (=n+k) 3:1 selectors. In this case, the semiconductor device to which two chips are connected includes eighteen 3:1 selectors.

Meanwhile, in the example of FIG. 3, the redundant group A includes five signal paths for four signal paths of the circuit IC. That is, the redundant group A includes one spare signal path. Thus, in the semiconductor chip 2, the selection circuit SELC2 corresponding to the redundant group A includes four 2:1 selectors SEL (the selectors SEL having one output for two inputs). Further, if the redundant group B includes one spare signal path for four signal paths, in the semiconductor chip 2, the selection circuit SELC corresponding to the redundant group B includes four 2:1 selectors SEL. Thus, the semiconductor chip 2 includes eight 2:1 selectors SEL. Further, the semiconductor chip 1 includes ten (=(4+1)×2) 2:1 selectors. In this case, the semiconductor device SEM to which two semiconductor chips 1 and 2 are connected includes eighteen 2:1 selectors SEL.

The circuit scale of the selector and a bit number of the selecting signal increase with an increase in the number of input signals of the selector. That is, the circuit scale of eighteen 2:1 selectors SEL is smaller than that of eighteen 3:1 selectors. As such, this embodiment may suppress an increase in circuit scale, in comparison with a configuration where the plurality of signal paths is not divided into the plurality of redundant groups.

Meanwhile, the configuration of the redundant circuits RDD1 and RDD2 is not limited to the example discussed above. For example, the redundant circuit RDD2 may have an ECC circuit that checks for an Error Correcting Code (ECC). In this case, for example, the ECC circuit receives data (e.g., test data DS10 to DS13) from the flip-flop part TFF20, and then checks for the ECC for the data received from the flip-flop part TFF20. Further, the ECC circuit outputs a signal TSIG indicating the result of checking the ECC to the test circuit TCNT1 through the bump BP20t.

Further, a data transmitting direction of the redundant group B may be equal to or opposite to a data transmitting direction of the redundant group A. For example, if the data transmitting direction of the redundant group B is opposite to that data transmitting direction of the redundant group A, the redundant circuit RDD1 includes a register REG2, a decoder DEC2, a selection circuit SELC2 and a flip-flop part TFF20 for a test, which correspond to the redundant group B. Furthermore, the redundant circuit RDD2 includes a register REG1, a decoder DEC1, a selection circuit SELC1 and a flip-flop part TFF10 for a test, which correspond to the redundant group B.

Further, for example, the test circuit TCNT1 may be omitted from the redundant circuit RDD1 of the semiconductor chip 1, and may be installed on the redundant circuit RDD2 of the semiconductor chip 2. Furthermore, for example, the redundant group may have two or more spare signal paths (e.g., terminals TMF and TMS, and bumps BP). In this case, the circuit scale of the redundant group having the plurality of spare signal paths increases, but the increase in circuit scale of the entire semiconductor device SEM is suppressed. As such, the semiconductor device SEM is capable of improving the resistance against a failure such as short-circuits of neighboring wirings, while suppressing the increase in circuit scale. As a result, the yield of the semiconductor device SEM is improved.

Figure 4:
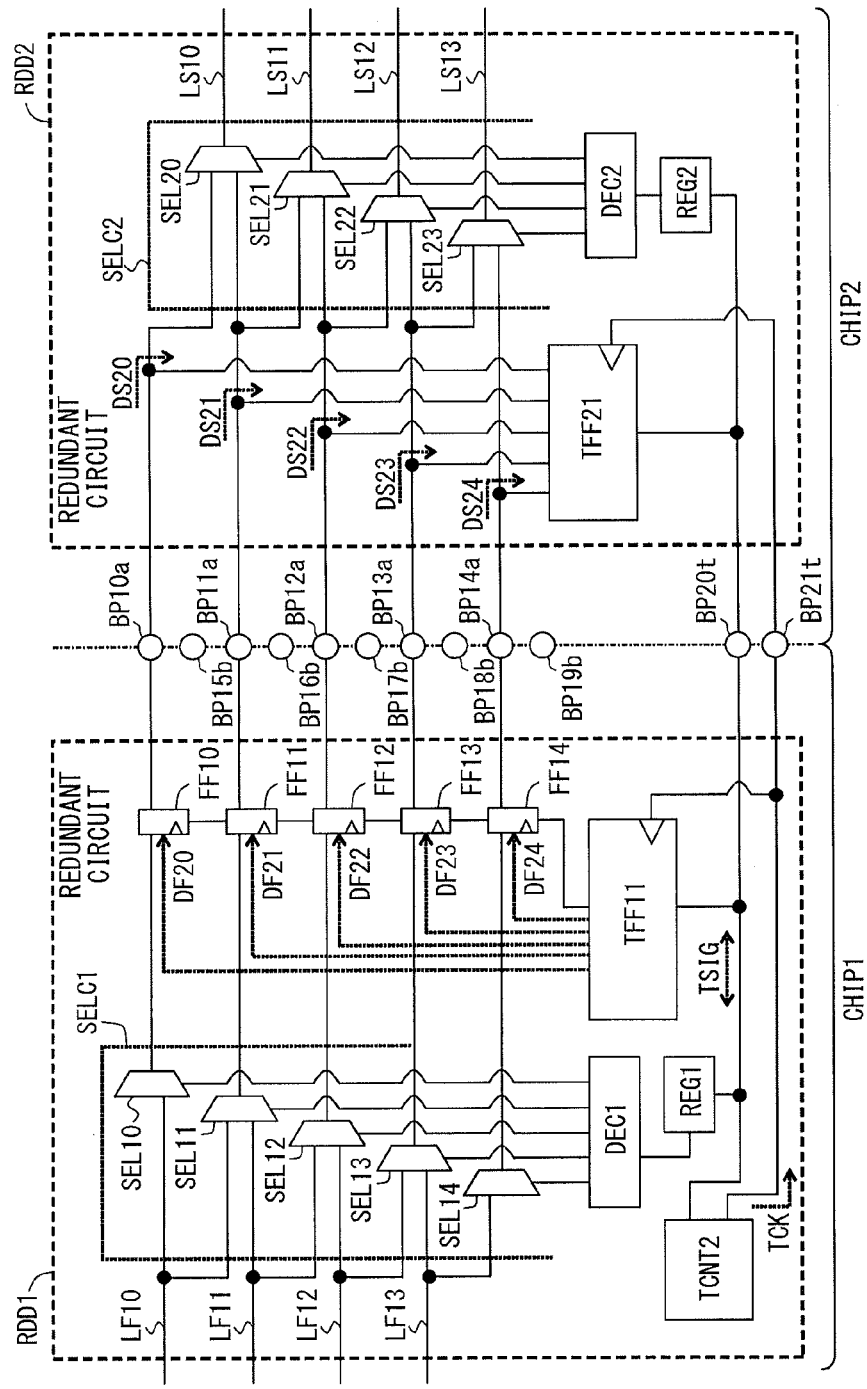
FIG. 4 is a view illustrating another example of the redundant circuit illustrated in FIG. 1.

FIG. 4 is a view illustrating another example of the redundant circuits RDD1 and RDD2 illustrated in FIG. 1. Elements common to both FIGS. 3 and 4 will carry the same reference characters, and the detailed descriptions thereof will be omitted herein. For example, the dashed-line arrow, the meaning of suffixes a, b and t of the bumps BP, or the number of the bumps BP belonging to the redundant groups A and B in FIG. 4 are equal or similar to those of FIG. 3. Further, FIG. 4 omits, for example, the terminals TMF and TMS in a similar manner to FIG. 3. FIG. 4 also omits the signal line for a drive clock of the flip-flops FF10 to FF14.

The redundant circuit RDD1 illustrated in FIG. 4 includes a test circuit TCNT2, a flip-flop part TFF11 for a test, a register REG1, a decoder DEC1, a selection circuit SELC1, and flip-flops FF (FF10, FF11, FF12, FF13 and FF14). The flip-flop part TFF11, the register REG1, the decoder DEC1, the selection circuit SELC1, and the flip-flops FF10 to FF14 are installed to correspond to, for example, each of the plurality of redundant groups. FIG. 4 omits the flip-flop part TFF11, the register REG1, the decoder DEC1, the selection circuit SELC1, and the flip-flop FF, which correspond to a redundant group (e.g., the redundant group B) except the redundant group A.

The test circuit TCNT2 transceives a signal TSIG between the flip-flop parts TFF11 and TFF21, instead of the flip-flop parts TFF10 and TFF20 illustrated in FIG. 3. Other operations of the test circuit TCNT2 remain the same as or similar to those of the test circuit TCNT1 illustrated in FIG. 3.

The flip-flop part TFF11 includes a flip-flop to maintain, for example, each piece of test data DF20 to DF24. For example, the flip-flop part TFF11 receives the signal TSIG and the clock TCK indicating the test data DF20 to DF24 during the test, and then maintains the test data DF20 to DF24. Further, the flip-flop part TFF11 synchronizes the test data DF20 to DF24 with the clock TCK to be output to the flip-flops FF10 to FF14 such that respective values of the test data DF20 to DF24 are set to the flip-flops FF10 to FF14 through, for example, the scan chains. As such, the flip-flop part TFF11 is different from the flip-flop part TFF10 in a location in which the maintained data DF is output.

The register REG1 and the decoder DEC1 of FIG. 4 are equal or similar to the register REG1 and the decoder DEC1 of FIG. 3. For example, the decoder DEC1 generates a selecting signal of each of the selectors SEL10 to SEL14 of the selection circuit SELC1, based on information received from the register REG1 (e.g., information indicating the detouring the signal path).

The selection circuit SELC1 is equal or similar to the selection circuit SELC1 illustrated in FIG. 3, except for an output location. For example, the selection circuit SELC1 selects a signal path (e.g., flip-flop FF, bump BP, and terminals TMF and TMS) used to transmit data between the semiconductor chips 1 and 2.

The selection circuit SELC1 selects four flip-flops FF electrically connected to four lines of the circuit IC1, that is, signal lines LF10, LF11, LF12 and LF13, respectively, among five flip-flops FF10 to FF14. That is, the selection circuit SELC1 selects four bumps BP used for signal paths between the signal lines LF10 to LF13 that are four lines of the circuit IC1 and signal lines LS10 to LS13 that are four lines of the circuit IC2, among five bumps BP10a to BP14a.

For example, the selection circuit SELC1 includes selectors SEL10 to SEL14. The selectors SEL10 to SEL14 are equal or similar to the selectors SEL10 to SEL14 illustrated in FIG. 3 except for an output location.

One of two input terminals of the selector SEL10 is connected to the signal line LF10, while the other of the two input terminals is in an open state. Thus, the selector SEL10 receives a signal transmitted to the signal line LF10. Further, the selector SEL10 receives a selecting signal from the decoder DEC1. Furthermore, the selector SEL10 electrically connects the signal line LF10 to the flip-flop FF10, based on the selecting signal from the decoder DEC1.

Meanwhile, when the selecting signal from the decoder DEC1 indicates a non-selection of the bump BP10a, the selector SEL10 causes the signal line LF10 and the flip-flip FF10 to be in an electrically non-connection state. As such, the selector SEL10 outputs the signal transmitted to the signal line LF10, through the flip-flop FF10, to the bump BP10a, based on the selecting signal from the decoder DEC1. The selector SEL10 may be a switch that converts a state from a conductive state to a non-conductive state, and vice versa.

Two input terminals of the selector SEL11 are connected to the signal lines LF10 and LF11, respectively. Thus, the selector SEL11 receives a signal transmitted to the signal line LF10 and a signal transmitted to the signal line LF11. Further, the selector SEL11 receives the selecting signal from the decoder DEC1. Furthermore, the selector SEL11 electrically connects either one of the signal lines LF10 and LF11 to the flip-flop FF11, based on the selecting signal from the decoder DEC1. That is, the selector SEL11 outputs either one of the signal transmitted to the signal line LF10 and the signal transmitted to the signal line LF11 through the flip-flop FF11 to the bump BP11a, based on the selecting signal from the decoder DEC1.

The two input terminals of the selector SEL12 are connected to the signal lines LF11 and LF12, respectively. Thus, the selector SEL12 receives a signal transmitted to the signal line LF11 and a signal transmitted to the signal line LF12. Further, the selector SEL12 receives the selecting signal from the decoder DEC1. Furthermore, the selector SEL12 electrically connects either one of the signal lines LF11 and LF12 to the flip-flop FF12, based on the selecting signal from the decoder DEC1. That is, the selector SEL12 outputs either one of the signal transmitted to the signal line LF11 and the signal transmitted to the signal line LF12 through the flip-flop FF12 to the bump BP12a, based on the selecting signal from the decoder DEC1.

The two input terminals of the selector SEL13 are connected to the signal lines LF12 and LF13, respectively. Thus, the selector SEL13 receives a signal transmitted to the signal line LF12 and a signal transmitted to the signal line LF13. Further, the selector SEL13 receives the selecting signal from the decoder DEC1. Furthermore, the selector SEL13 electrically connects either one of the signal lines LF12 and LF13 to the flip-flop FF13, based on the selecting signal from the decoder DEC1. That is, the selector SEL13 outputs either one of the signal transmitted to the signal line LF12 and the signal transmitted to the signal line LF13 through the flip-flop FF13 to the bump BP13a, based on the selecting signal from the decoder DEC1.

One of two input terminals of the selector SEL14 is connected to the signal line LF13, while the other of the two input terminals is in an open state. Thus, the selector SEL14 receives a signal transmitted to the signal line LF13. Further, the selector SEL14 receives a selecting signal from the decoder DEC1. Furthermore, the selector SEL14 electrically connects the signal line LF13 to the flip-flop FF14, based on the selecting signal from the decoder DEC1.

Meanwhile, when the selecting signal from the decoder DEC1 indicates a non-selection of the bump BP14a, the selector SEL14 causes the signal line LF13 and the flip-flip FF14 to be in an electrically non-connection state. As such, the selector SEL14 outputs the signal transmitted to the signal line LF13, through the flip-flop FF14, to the bump BP14a, based on the selecting signal from the decoder DEC1. The selector SEL14 may be a switch that converts a state from a conductive state to a non-conductive state, and vice versa.

The flip-flops FF10 to FF14 maintain data output from, for example, the selectors SEL10 to SEL14, respectively. Further, the flip-flops FF10 to FF14 synchronize data received from the selectors SEL10 to SEL14, with a drive clock such as a system lock, to output the data to each of the bumps BP10a to BP14a.

Meanwhile, during a test such as a connection test, the flip-flops FF10 to FF14 maintain test data DF20 to DF24, respectively, output from, for example, the flip-flop part TFF1. Further, the flip-flops FF10 to FF14 synchronize test data DF20 to DF24 received from the flip-flop part TFF1 with a drive clock such as a test clock, to output the test data to each of the bumps BP10a to BP14a. As such, the flip-flop part TFF11 may transmit the test data DF20 to DF24 through the bumps BP10a to BP14a to the semiconductor chip 2, regardless of a selected state of the selection circuit SELC1, during the test.

The redundant circuit RDD2 illustrated in FIG. 4 includes a register REG2, a decoder DEC2, a selection circuit SELC2, and a flip-flop part TFF21 for a test. The register REG2, the decoder DEC2, the selection circuit SELC2, and the flip-flop part TFF21 for the test are installed to correspond to, for example, each of the plurality of redundant groups. FIG. 4 omits the register REG2, the decoder DEC2, the selection circuit SELC2, and the flip-flop part TFF21 for the test, which correspond to a redundant group (e.g., the redundant group B) except the redundant group A.

The register REG2, the decoder DEC2, and the selection circuit SELC2 are equal or similar to the register REG2, the decoder DEC2, and the selection circuit SELC2 illustrated in FIG. 3. For example, the decoder DEC2 generates a selecting signal of each of the selectors SEL20 to SEL23 of the selection circuit SELC2, based on information (information indicating the detouring the signal path) received from the register REG2. Further, for example, the selection circuit SELC2 selects a signal path used to transmit data between the semiconductor chips 1 and 2.

The flip-flop part TFF21 includes a flip-flop to maintain, for example, each piece of test data DS20 to DS24. For example, the flip-flop part TFF21 receives the test data DS20 to DS24 from the semiconductor chip 1 through the bumps BP10a to BP14a, respectively, during the test, and receives the clock TCK from the test circuit TCNT2 through the bump BP21t. As a result, the flip-flop part TFF21 maintains the test data DS20 to DS24. Further, the flip-flop part TFF21 synchronizes a signal TSIG indicating the test data DS20 to DS24 with the clock TCK, thus outputting the signal TSIG to the test circuit TCNT2 through the bump BP20t.

As such, the flip-flop part TFF21 may receive the test data DS20 to DS24 from the semiconductor chip 1 through the bumps BP10a to BP14a, regardless of a selected state of the selection circuit SELC2, during the test such as the connection test. Meanwhile, the test data DS20 to DS24 corresponds to the test data DF20 to DF24, respectively. For example, if there is no failure in the signal path used to transmit data between the semiconductor chips 1 and 2, the test data DS20 to DS24 coincides with the test data DF20 to DF24.

Here, if the bumps BP12a and BP16b, for example, cause a short-circuit, the selection circuit SELC (SELC1 and SELC2) corresponding to the redundant group A selects the bumps BP10a, BP11a, BP13a and BP14a other than the bump BP12a. That is, the signal line LF10 in the semiconductor chip 1 is electrically connected to the signal line LS10 in the semiconductor chip 2, via the selector SEL10, the flip-flop FF10, the bump BP10a and the selector SEL20. The signal line LF11 in the semiconductor chip 1 is electrically connected to the signal line LS11 in the semiconductor chip 2, via the selector SEL11, the flip-flop FF11, the bump BP11a, and the selector SEL21.

The signal line LF12 in the semiconductor chip 1 is electrically connected to the signal line LS12 in the semiconductor chip 2, via the selector SEL13, the flip-flop FF13, the bump BP13a, and the selector SEL22. The signal line LF13 in the semiconductor chip 1 is electrically connected to the signal line LS13 in the semiconductor chip 2, via the selector SEL14, the flip-flop FF14, the bump BP14a and the selector SEL23.

Further, the selection circuit SELC corresponding to the redundant group B selects the bumps BP15b, BP17b, BP18b, and BP19b other than the bump BP16b. As a result, the semiconductor device SEM may relieve the signal path between the semiconductor chips 1 and 2, even if neighboring wirings (e.g., the bumps BP12a, and BP16b) cause short-circuits. As such, in the case of detouring a defective signal path, the redundant circuit RDD (RDD1 and RDD2) selects the terminals TMF and TMS used to transmit data between the semiconductor chips 1 and 2, based on the test result, per redundant group.

Meanwhile, the configuration of the redundant circuits RDD1 and RDD2 is not limited to this example. For example, the redundant circuit RDD2 may have an ECC circuit that checks for an ECC. In this case, for example, the ECC circuit checks for the ECC for data (e.g., test data DS20 to DS24) received from the flip-flop part TFF21. Further, the ECC circuit outputs a signal TSIG indicating the result of checking for the ECC to the test circuit TCNT2 through the bump BP20t.

Further, a data transmitting direction of the redundant group B may be equal to or opposite to a data transmitting direction of the redundant group A. For example, if the data transmitting direction of the redundant group B is opposite to the data transmitting direction of the redundant group A, the redundant circuit RDD1 includes a register REG2, a decoder DEC2, a selection circuit SELC2, and a flip-flop part TFF20 for a test, which correspond to the redundant group B. Furthermore, the redundant circuit RDD2 includes, for example, a register REG1, a decoder DEC1, a selection circuit SELC1, a flip-flop part TFF10 for a test, and a flip-flop FF, all of which correspond to the redundant group B.

Further, for example, the test circuit TCNT2 may be omitted from the redundant circuit RDD1 of the semiconductor chip 1, and may be installed in the redundant circuit RDD2 of the semiconductor chip 2. Furthermore, for example, the redundant group may have two or more spare signal paths (e.g., flip-flop FF, terminals TMF and TMS, and bumps BP). In this case, although the circuit scale of the redundant group having the plurality of spare signal paths increases, the increase in circuit scale of the entire semiconductor device SEM is suppressed. The flip-flops FF10 to FF14 may be omitted.

Figure 5:
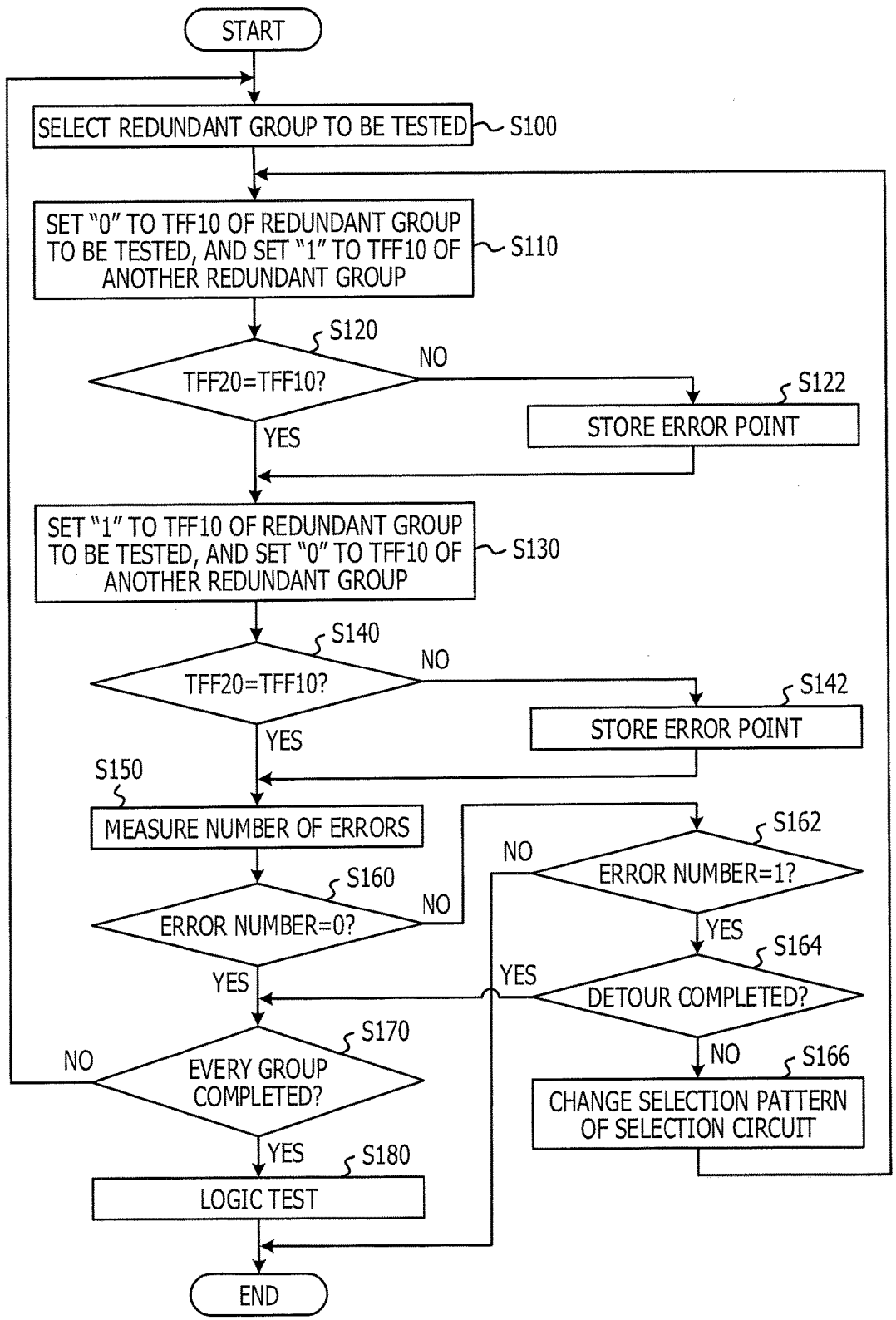
FIG. 5 is a view illustrating an example of the method of testing the semiconductor device illustrated in FIG. 1.

FIG. 5 is a view illustrating an example of the method of testing the semiconductor device SEM illustrated in FIG. 1. That is, FIG. 5 illustrates one type of testing method of the semiconductor device. Meanwhile, redundant circuits RDD1 and RDD2 are, for example, the redundant circuits RDD1 and RDD2 illustrated in FIG. 3. Further, a spare signal path of each redundant group is one. An operation of FIG. 5 is realized by controlling a test circuit TCNT1 using, for example, a testing device for testing the semiconductor device SEM.

At step S100, the test circuit TCNT1 selects a redundant group to be tested, among a plurality of redundant groups. For example, the testing device for testing the semiconductor device SEM controls the test circuit TCNT1, and then selects the redundant group to be tested, among the plurality of redundant groups.

At step S110, the test circuit TCNT1 sets "0" to a flip-flop part TFF10 corresponding to the redundant group to be tested, and sets "1" to a flip-flop part TFF10 corresponding to different redundant groups (e.g., redundant groups other than the redundant group to be tested). For example, the testing device sets the values of all of the flip-flops in the flip-flop part TFF10 corresponding to the redundant group to be tested, as "0", through the test circuit TCNT1. Further, the testing device sets the values of all of the flip-flops in the flip-flop part TFF10 corresponding to redundant groups other than the redundant group to be tested, as "1", through the test circuit TCNT1.

Thus, low level (logic value "0") data and high level (logic value "1") data are transmitted, respectively, to a signal path corresponding to the redundant group to be tested and a signal path corresponding to the redundant groups other than the redundant group to be tested.

At step S120, the testing device determines whether a value set to the flip-flop part TFF10 is equal to a value maintained in the flip-flop part TFF20. For example, data on the value set to the flip-flop part TFF10 at step S110 is transmitted, through, for example, the selection circuit SELC1, the bump BP, and the selection circuit SELC2, to the flip-flop part TFF20.

As a result, the flip-flop part TFF20 maintains the value set to the flip-flop part TFF10 at step S110. Further, the flip-flop part TFF20 transmits data on the maintained value, through, for example, the bump BP20t, to the test circuit TCNT1. The testing device receives the data on the value maintained in the flip-flop part TFF20 from the test circuit TCNT1. Further, the testing device determines whether the value set to the flip-flop part TFF10 is equal to the value maintained in the flip-flop part TFF20.

If it is determined that a value of the flip-flop part TFF10 is equal to a value of the flip-flop part TFF20 ("YES" at step S120), the operation of the testing device proceeds to step S130. In contrast, if it is determined that the value of the flip-flop part TFF10 is not equal to the value of the flip-flop part TFF20 ("NO" at step S120), the operation of the testing device proceeds to step S122.

At step S122, the testing device stores an error point in the redundant group to be tested, which is selected at step S100. For example, the testing device stores information indicating a defective signal path among signal paths belonging to the redundant group to be tested. Meanwhile, among the flip-flops in the flip-flop parts TFF10 and TFF20 of the redundant group to be tested, a signal path between the flip-flops where the value of the flip-flop part TFF10 is not equal to the value of the flip-flop part TFF20 is a defective signal path.

At step S130, the test circuit TCNT1 sets "1" to the flip-flop part TFF10 corresponding to the redundant group to be tested, and sets "0" to the flip-flop part TFF10 corresponding to different redundant groups (e.g., redundant groups other than the redundant group to be tested). Step S130 is equal to or similar to step S110 except that the logic value set to the flip-flop part TFF10 of the redundant group to be tested and the logic value set to the flip-flop part TFF10 of the redundant groups other than the redundant group to be tested are opposite to those of step S110.

At step S140, the testing device determines whether a value set to the flip-flop part TFF10 is equal to a value maintained in the flip-flop part TFF20. Step S140 is equal to or similar to step S120. If it is determined that a value of the flip-flop part TFF10 is equal to a value of the flip-flop part TFF20 ("YES" at step S140), the operation of the testing device proceeds to step S150. In contrast, if it is determined that the value of the flip-flop part TFF10 is not equal to the value of the flip-flop part TFF20 ("NO" at step S140), the operation of the testing device proceeds to step S142.

At step S142, the testing device stores an error point in the redundant group to be tested, which is selected at step S100. Step S142 is equal to or similar to step S122.

At step S150, the testing device measures the number of errors in the redundant group to be tested, which is selected at step S100. Meanwhile, if the error point stored at step S122 and the error point stored at step S142 are the same signal path, the testing device counts the error number as one. That is, the testing device counts the number of defective signal paths as the error number. Further, at step S150 executed after detouring the error point by, for example, step S166, the testing device measures a cumulative error number (e.g., a total number of defective signal paths until a present stage) including error points detected in preceding stages.

At step S160, the testing device determines whether the error number measured at step S150 is 0 or not. If it is determined that the error number is 0 ("YES" at step S160), an operation of the testing device proceeds to step S170. If, however, it is determined that the error number is not 0 ("NO" at step S160), the operation of the testing device proceeds to step S162.

At step S162, the testing device determines whether the error number measured at step S150 is 1 or not. If it is determined that the error number is 1 ("YES" at step S162), an operation of the testing device proceeds to step S164. If, however, it is determined that the error number is not 1 ("NO" at step S162), the test of the semiconductor device SEM is completed. That is, if the error number is 2 or more, the test of the semiconductor device SEM is completed. If the error number exceeds the number of the spare signal path (one in FIG. 5), it is handled as an error because the semiconductor device SEM may not relieve the defective signal path.

At step S164, the testing device determines whether the error point (e.g., the defective signal path) has been detoured. For example, if it is determined that the error point (e.g., the defective signal path) stored, for example, at step S122 is previously set to the registers REG1 and REG2, the testing device determines that the detour of the error point has been completed. As such, the testing device determines whether a current selection pattern of the selection circuits SELC1 and SELC2 is a selection pattern detouring the error point (e.g., defective signal path) stored, for example, at step S122.

If it is determined that the error point is already detoured ("YES" at step S164 is Yes), an operation of the testing device proceeds to step S170. Meanwhile, if it is determined that the error point is not detoured ("NO" at step S164), the operation of the testing device proceeds to step S166.

At step S166, the testing device changes the selection patterns of the selection circuits SELC1 and SELC2 to detour the error point. For example, the testing device sets information indicating a detouring signal path, through the test circuit TCNT1, to the registers REG1 and REG2, based on the error point stored, for example, at step S122.

That is, the test circuit TCNT1 sets the information indicating the detouring signal path to the registers REG1 and REG2. The decoders DEC1 and DEC2 generate selecting signals of the selection circuits SELC1 and SELC2, based on the information set to the registers REG1 and REG2. As a result, the selection patterns (selecting signals) of the selection circuits SELC1 and SELC2 are changed into a pattern detouring the error point.

After the selection patterns of the selection circuits SELC1 and SELC2 are changed into the pattern detouring the error point, the testing device performs step S110. That is, after step S166, an operation of the testing device returns to step S110. As such, if it is possible to evade the defective signal path, the redundant circuits RDD1 and RDD2 select terminals TMF and TMS used to transmit data between the semiconductor chips 1 and 2, based on a test result, per redundant group.

At step S170, the testing device determines whether a connection test has been executed for every redundant group. If it is determined that there is a redundant group in which the connection test is not executed ("NO" at step S170), an operation of the testing device returns to step S100. Meanwhile, if the connection test is performed for every redundant group ("YEs" at step S170), the testing device executes a logic test at step S180, and completes the test of the semiconductor device SEM.

As such, the test circuit TCNT1 executes a first test (e.g., steps S110 to S122) and a second test (e.g., steps S130 to S142) which is the reverse of a polarity of the first test, for every redundant group. For example, in the first test, the test circuit TCNT1 respectively transmits low level (logic value "0") data and high level (logic value "1") data to a signal path corresponding to the redundant group to be tested and a signal path corresponding to the redundant groups other than the redundant group to be tested. Also, in the second test, the test circuit TCNT1 respectively transmits high level (logic value "1") data and low level (logic value "0") data to the signal path corresponding to the redundant group to be tested and the signal path corresponding to the redundant groups other than the redundant group to be tested.

Further, if it is possible to evade the defective signal path, the redundant circuits RDD1 and RDD2 select terminals TMF and TMS used to transmit data between the semiconductor chips 1 and 2, based on the results of the first and second tests (e.g., step S166).

Meanwhile, the method of testing the semiconductor device SEM is not limited to this example. For example, step S164 may be omitted. In this case, for example, the testing device counts the error number as 0, if it is determined that the value of the flip-flop part TFF10 is equal to the value of the flip-flop part TFF20 at both steps S120 and S140, after the error point is detoured.

Further, in the redundant group having spare signal paths of k lines, the testing device determines whether the error number exceeds k, at step S162. If it is determined that the error number is k or less, an operation of the testing device proceeds to step S164.

Figure 6:
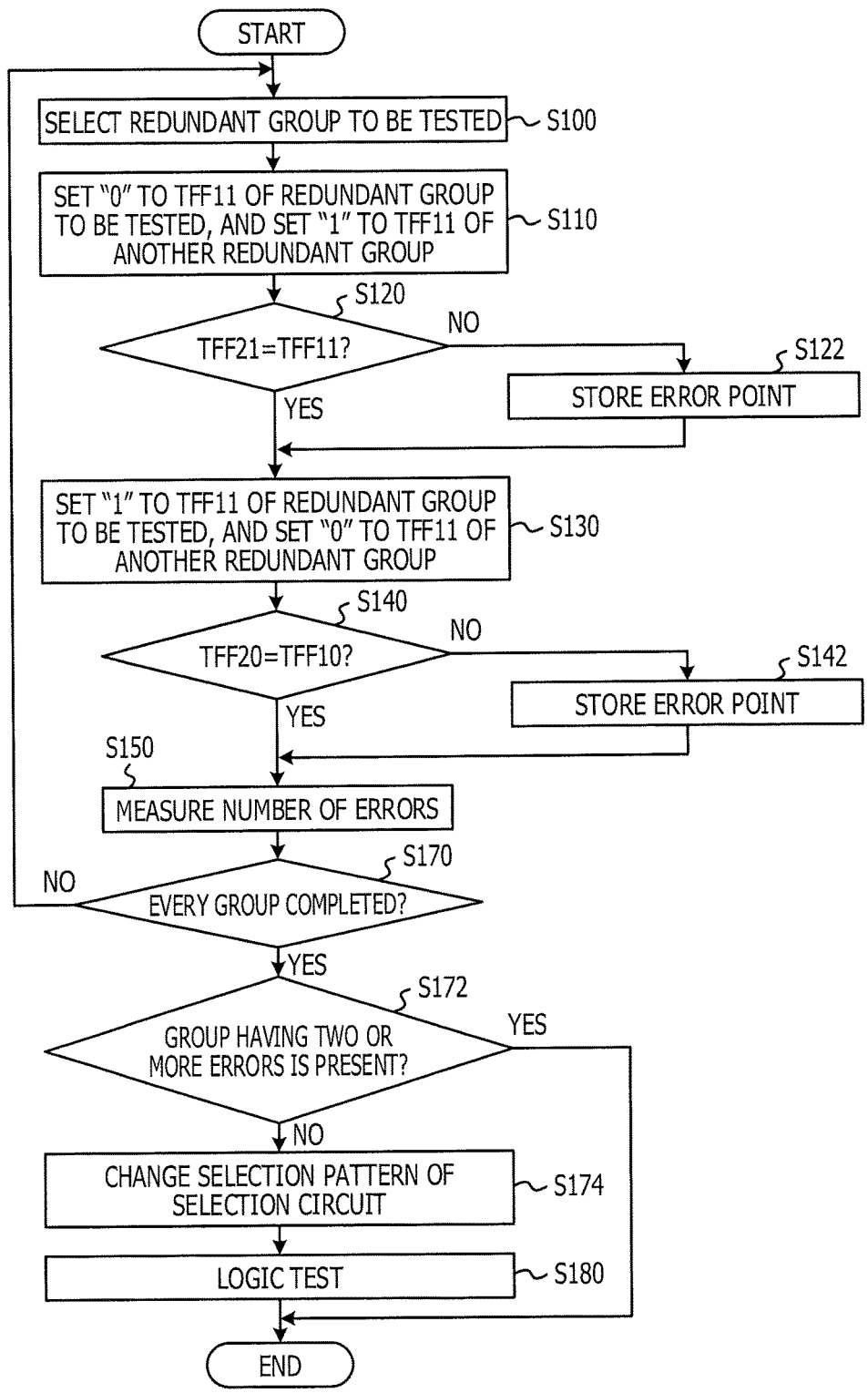
FIG. 6 is a view illustrating another example of the method of testing the semiconductor device illustrated in FIG. 1.

FIG. 6 is a view illustrating another example of the method of testing the semiconductor device SEM illustrated in FIG. 1. That is, FIG. 6 illustrates one type of testing method of the semiconductor device. Meanwhile, redundant circuits RDD1 and RDD2 are, for example, the redundant circuits RDD1 and RDD2 illustrated in FIG. 4. Further, a spare signal path of each redundant group is one. The operation of FIG. 6 is realized by controlling a test circuit TCNT2 using, for example, a testing device for testing the semiconductor device SEM. The detailed description of the operation common to both FIG. 5 and FIG. 6 will be omitted herein.

Steps S100 to S150 are equal to or similar to steps S100 to S150 described in FIG. 5. For example, at step S100, the test circuit TCNT2 selects a redundant group to be tested, among a plurality of redundant groups.

At step S110, the test circuit TCNT2 sets "0" to a flip-flop part TFF11 corresponding to the redundant group to be tested, and sets "1" to a flip-flop part TFF11 corresponding to different redundant groups (e.g., redundant groups other than the redundant group to be tested). In an operation of FIG. 6, data on a logic value set at step S110 is transmitted to all signal paths including the spare signal path.

At step S120, the testing device determines whether a value set to the flip-flop part TFF11 is equal to a value maintained in the flip-flop part TFF21. If it is determined that a value of the flip-flop part TFF11 is equal to a value of the flip-flop part TFF21 ("YES" at step S120), the operation of the testing device proceeds to step S130. In the meantime, if it is determined that the value of the flip-flop part TFF11 is not equal to the value of the flip-flop part TFF21 ("NO" at step S120), the operation of the testing device proceeds to step S122.

At step S122, the testing device stores an error point in the redundant group to be tested, which is selected at step S100.

At step S130, the test circuit TCNT1 sets "1" to the flip-flop part TFF11 corresponding to the redundant group to be tested, and sets "0" to the flip-flop part TFF11 corresponding to different redundant groups (e.g., redundant groups other than the redundant group to be tested).

At step S140, the testing device determines whether a value set to the flip-flop part TFF11 is equal to a value maintained in the flip-flop part TFF21. If it is determined that a value of the flip-flop part TFF11 is equal to a value of the flip-flop part TFF21 ("YES" at step S140), the operation of the testing device proceeds to step S150. If, however, it is determined that the value of the flip-flop part TFF11 is not equal to the value of the flip-flop part TFF21 ("NO" at step S140), the operation of the testing device proceeds to step S142.

At step S142, the testing device stores an error point in the redundant group to be tested, which is selected at step S100.

At step S150, the testing device measures the number of errors in the redundant group to be tested, which is selected at step S100. In the operation of FIG. 6, all signal paths belonging to the redundant group to be tested, which is selected at step S100, are tested by performing steps S110 to S142 once, regardless of the selected state of the selection circuits SELC1 and SELC2. At step S150, the number of defective signal paths is measured per redundant group to be tested.

In the operation of FIG. 6, the process corresponding to steps S160 to S162 of FIG. 5 is performed at step S172 after step S170.

At step S170, the testing device determines whether a connection test has been executed for every redundant group. If it is determined that there is a redundant group in which the connection test is not executed ("NO" at step S170), an operation of the testing device returns to step S100. Meanwhile, if it is determined that the connection test is performed for every redundant group ("YES" at step S170), the operation of the testing device proceeds to step S172.

At step S172, the testing device determines whether there is a redundant group in which the error number measured at step S150 is 2 or more. If it is determined that there is the redundant group in which the error number is 2 or more ("YES" at step S172), the test of the semiconductor device SEM is completed. If the error number exceeds the number of the spare signal path (one in FIG. 5), it is handled as an error because the semiconductor device SEM may not relieve the defective signal path.

Meanwhile, if it is determined that there is no redundant group in which the error number is 2 or more ("NO" at step S172), the operation of the testing device proceeds to step S174. When the error number of each redundant group is equal to or less than the number of the spare signal path (one in FIG. 5), the semiconductor device SEM may relieve the defective signal path.

At step S174, the testing device sets selection patterns of the selection circuits SELC1 and SELC2, based on the error point stored, for example, at step S122. For example, the testing device sets information indicating a detouring signal path through the test circuit TCNT1 to the registers REG1 and REG2, for the redundant group including the defective signal path.

That is, the test circuit TCNT1 sets information indicating the detouring signal path to the registers REG1 and REG2 per redundant group. The decoders DEC1 and DEC2 generate selecting signals of the selection circuits SELC1 and SELC2, based on information set to the registers REG1 and REG2. As a result, the selection patterns (selecting signals) of the selection circuits SELC1 and SELC2 are set as a pattern detouring the error point.

At step S180, the testing device executes a logic test. As a result, the test of the semiconductor device SEM is completed. As such, in the testing method of FIG. 6, it is possible to test the signal path belonging to each redundant group by performing the process of steps S110 to S142 once per redundant group. Therefore, the testing method of FIG. 6 may shorten a test time, in comparison with the testing method of FIG. 5.

Meanwhile, the testing method of the semiconductor device SEM is not limited to these examples. For example, if the number of spare signal paths is k, the testing device determines whether there is a redundant group in which its error number exceeds k, at step S172. In this case, a redundant group having the number of spare signal paths, which is different from k, may also be present. If there is no redundant group in which its error number exceeds k, the operation of the testing device proceeds to step S174.

Figure 7:
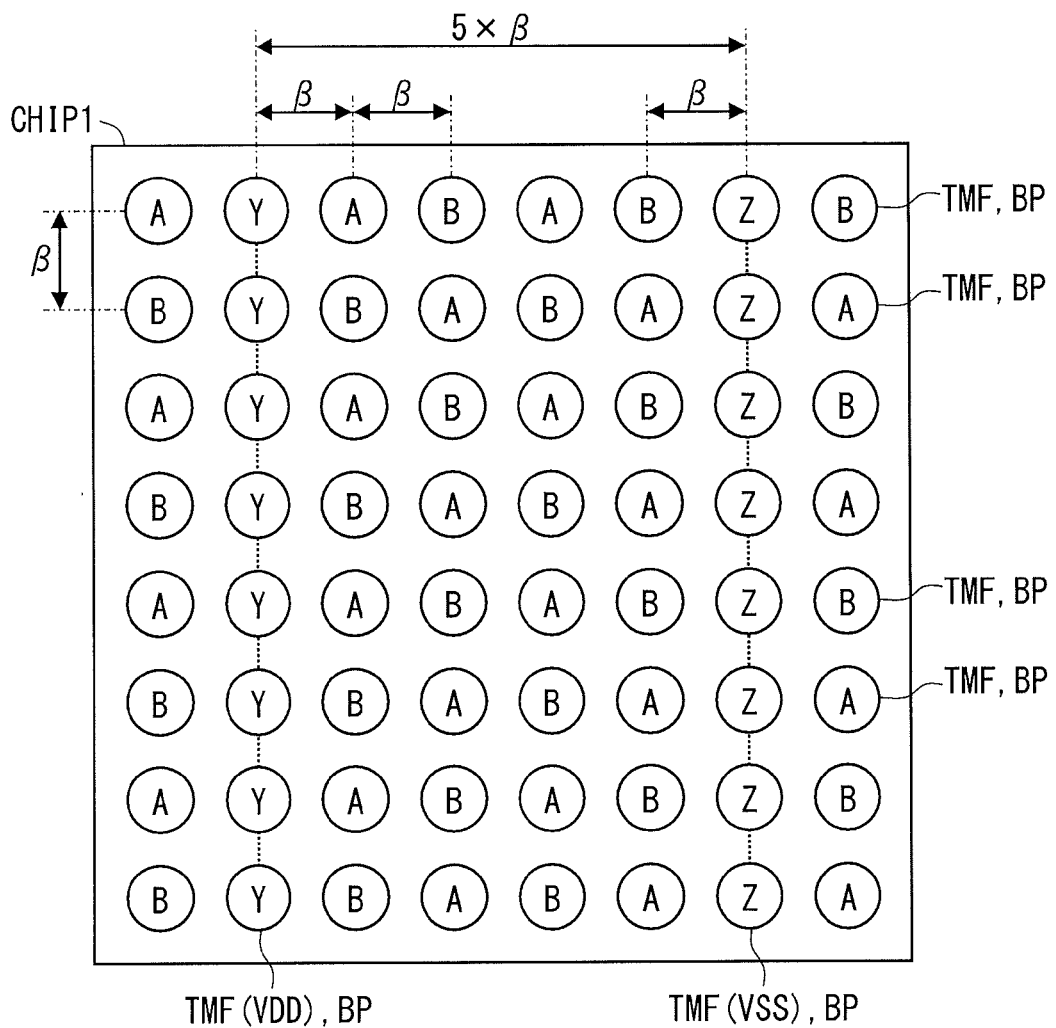
FIG. 7 is a view illustrating another example of the terminal arrangement of the semiconductor chip illustrated in FIG. 1.

FIG. 7 shows another example of the terminal arrangement of the semiconductor chip 1 illustrated in FIG. 1. Elements common to both FIGS. 2 and 7 will carry the same reference characters, and the detailed descriptions thereof will be omitted herein. For example, FIG. 7 illustrates the surface of the semiconductor chip 1. Meanwhile, the bumps BP connecting the terminals TMF to the terminals TMS of the semiconductor chip 2 are arranged equally or similarly to the arrangement of the terminals TMF. Further, the arrangement of the terminals TMS of the semiconductor chip 2 is equal or similar to, for example, an arrangement obtained by laterally reversing the terminal arrangement of FIG. 7.

In FIG. 7, a plurality of groups includes a plurality of redundant groups and a plurality of second group (hereinafter referred to as a common wiring group) to which the terminals TMF (e.g., power terminals) connected to a common node belong. In FIG. 7, reference characters A and B designate the redundant groups A and B, and reference characters Y and Z designate the common wiring groups Y and Z. That is, in the example of FIG. 2, the number of each of the redundant groups and the common wiring groups is two. Meanwhile, the redundant groups or the common wiring groups may be three or more.

The terminals TMF linked by a dashed line of FIG. 7 are connected to the common node. For example, the terminals TMF belonging to the common wiring group Y are power terminals connected to a power source VDD. Further, the terminals TMF belonging to the common wiring group Z are power terminals connected to a power source VSS.

For example, in the common wiring group Y, a plurality of signal paths (e.g., wirings including the bumps BP, and the terminals TMF and TMS) are connected to the common node. Hence, even if one line of the plurality of signal paths is lost, the signal path between the semiconductor chips 1 and 2 is maintained. Likewise, even if one line of the plurality of signal paths is lost in the common wiring group Z, the signal path between the semiconductor chips 1 and 2 is maintained.

The terminals TMF are arranged on the surface of the semiconductor chip 1 such that an interval between neighboring terminals is equal to or larger than a predetermined interval $\beta$. As illustrated in FIG. 2, the terminals TMF belonging to the same redundant group are arranged at an interval that is larger than the predetermined interval $\beta$. Further, a plurality of terminals TMF belonging to one common wiring group among a plurality of common wiring groups Y and Z, and a plurality of terminals TMF belonging to another common wiring group among the plurality of common wiring groups Y and Z have an interval that is larger than the predetermined interval $\beta$. In an example of FIG. 7, terminals TMF belonging to the common wiring group Y and terminals TMF belonging to the common wiring group Z have an interval represented by $5\times\beta$, which is larger than the predetermined interval $\beta$. As such, terminals TMF belonging to one of different common wiring groups Y and Z and terminals TMF belonging to the other of the different common wiring groups Y and Z are arranged such that an interval between the terminals of the different common wiring groups is larger than the predetermined interval $\beta$.

Accordingly, the terminal arrangement of FIG. 7 may decrease the probability that the terminals TMF of the different common wiring groups Y and Z cause a short-circuit, in comparison with an arrangement where terminals TMF belonging to different common wiring groups Y and Z are adjacently arranged at the predetermined interval β. Meanwhile, if, for example, the terminal TMF of the common wiring group Y and the terminal TMF of the redundant group A cause a short-circuit, the redundant circuit RDD may relieve a signal path by preventing the use of the terminal TMF that is short-circuited from the terminal TMF of the common wiring group Y, in the redundant group A.

Further, even if a short-circuit occurs between the terminals TMF of the common wiring group Y, the signal path is maintained because the terminals TMF of the common wiring group Y are originally connected to the common node. As such, the semiconductor device SEM may enhance the resistance to a failure caused by short-circuits between neighboring wirings, while suppressing an increase in circuit scale.

Meanwhile, the terminal arrangement of the semiconductor chip 1 is not limited to this arrangement. For example, the terminals TMF may be arranged in a zig-zag fashion as illustrated in FIG. 10. In this case, for example, in even-numbered rows of the terminals arranged in the zig-zag fashion, the terminals TMF belonging to the redundant groups A and B and the common wiring group Z, respectively, may be repeatedly arranged in order of the redundant groups A and B, and the common wiring group Z. Further, in odd-numbered rows of the terminals arranged in the zig-zag fashion, the terminals TMF belonging to the redundant group B, the common wiring group Y, and the redundant group A, respectively, may be repeatedly arranged in order of the redundant group B, the common wiring group Y, and the redundant group A.

Figure 8:
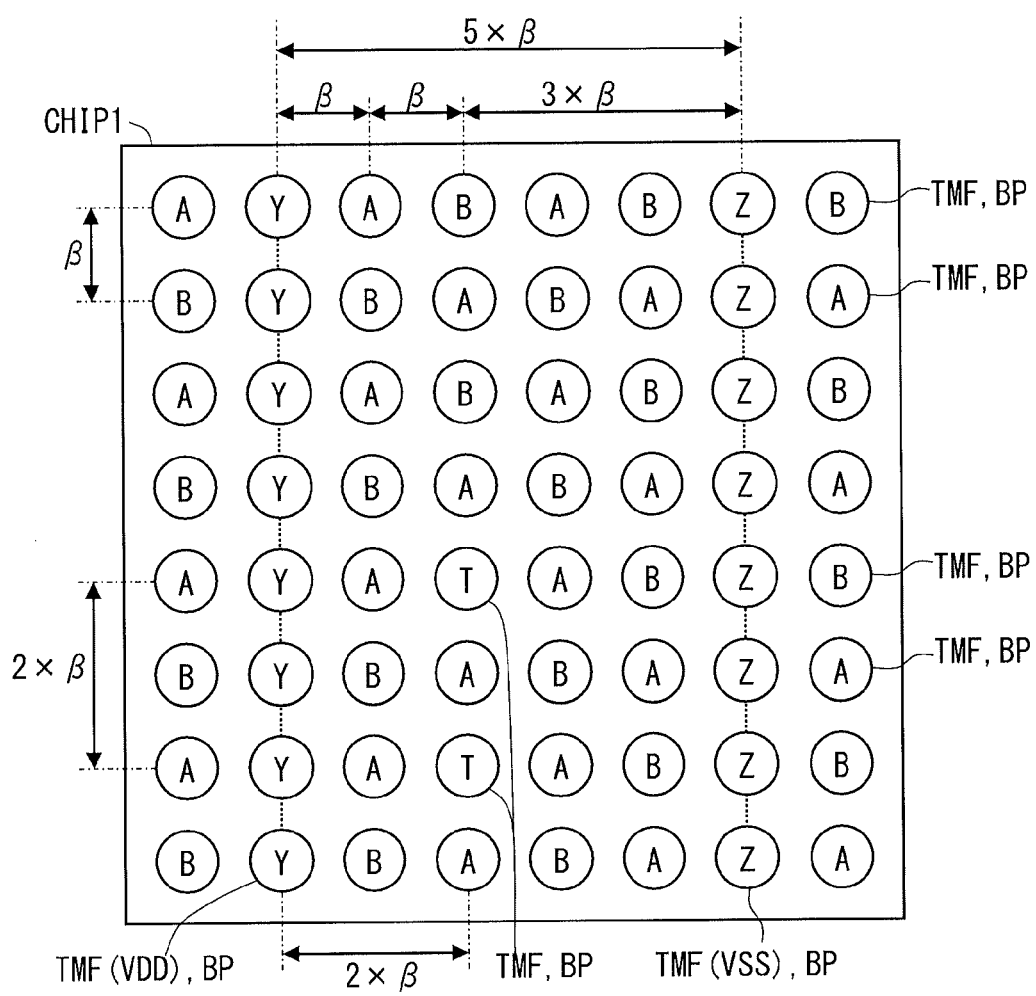
FIG. 8 is a view illustrating a further example of the terminal arrangement of the semiconductor chip illustrated in FIG. 1.

FIG. 8 shows a further example of the terminal arrangement of the semiconductor chip 1 illustrated in FIG. 1. Elements common to FIGS. 2, 7 and 8 will carry the same reference characters, and the detailed description thereof will be omitted herein. For example, FIG. 8 illustrates the surface of the semiconductor chip 1. Meanwhile, the bumps BP connecting the terminals TMF to the terminals TMS of the semiconductor chip 2 are arranged equally or similarly to the arrangement of the terminals TMF. Further, the arrangement of the terminals TMS of the semiconductor chip 2 is equal or similar to an arrangement obtained by laterally reversing the terminal arrangement of FIG. 8, for example.

In FIG. 8, a plurality of groups includes a plurality of redundant groups, a plurality of common wiring groups, and a third group. The third group includes, for example, non-redundant terminals TMF and TMS, for example. For example, the terminals TMF and TMS for the test, which are connected by the bumps BP20t and BP21t illustrated in FIG. 3 or the like, belong to the third group. In FIG. 8, reference characters A and B designate the redundant groups A and B, and reference characters Y and Z designate the common wiring groups Y and Z. Further, reference character T designates a third group T. That is, in the example of FIG. 2, the number of each of the redundant groups and the common wiring groups is two. Meanwhile, the redundant groups or the common wiring groups may be three or more. The meaning of the terminals TMF linked by the dashed line of FIG. 8 is equal or similar to that of FIG. 7.

The terminals TMF are arranged on the surface of the semiconductor chip 1 such that an interval between neighboring terminals is equal to or larger than a predetermined interval β. As illustrated in FIG. 2, the terminals TMF belonging to the same redundant group are arranged at an interval that is larger than the predetermined interval β. Further, as illustrated in FIG. 7, terminals TMF belonging to one of different common wiring groups Y and Z and terminals TMF belonging to the other of the different common wiring groups Y and Z are arranged such that an interval between the terminals of the different common wiring groups is larger than the predetermined interval β. Further, terminals TMF belonging to the third group T and terminals TMF belonging to any one of the plurality of common wiring groups Y and Z and the third group T are arranged at an interval that is larger than the predetermined interval β. That is, an interval between each of the plurality of terminals TMF belonging to the third group T and the terminals TMF belonging to the plurality of common wiring groups Y and Z is larger than the predetermined interval β, and an interval between the plurality of terminals TMF belonging to the third group T is also larger than the predetermined interval β.

In the example of FIG. 8, an interval between the terminals TMF belonging to the third group T and the terminals TMF belonging to the common wiring group Y is represented by 2×β, which is larger than the predetermined interval β. Further, an interval between the terminals TMF belonging to the third group T and the terminals TMF belonging to the common wiring group Z is represented by 3×β, which is larger than the predetermined interval β. An interval between the terminals TMF belonging to the third group T is represented by 2×β, which is larger than the predetermined interval β.

Accordingly, the terminal arrangement of FIG. 8 may decrease the probability that the terminals TMF of the third group T cause short-circuits, in comparison with an arrangement where terminals TMF of the third group T are adjacently arranged at the predetermined interval β. Moreover, the terminal arrangement of FIG. 8 may decrease a probability that a short-circuit occur between the terminals TMF of the third group T and the terminals TMF of the common wiring groups Y and Z, in comparison with an arrangement where terminals TMF of the common wiring groups Y and Z are arranged to be adjacent to the terminals TMF of the third group T at the predetermined interval β.

For example, if the short-circuit occur between the terminals TMF of the third group T and the terminals TMF of the redundant group A, the redundant circuit RDD may relieve a signal path by preventing the use of the terminal TMF that is short-circuited from the terminal TMF of the third group T, in the redundant group A. As such, the semiconductor device SEM may enhance the resistance to a failure caused by short-circuits between neighboring wirings, while suppressing the increase in circuit scale. Meanwhile, the terminal arrangement of the semiconductor chip 1 is not limited to this arrangement. For example, the terminals TMF may be arranged in a zig-zag fashion as illustrated in FIG. 10.

Figure 9:
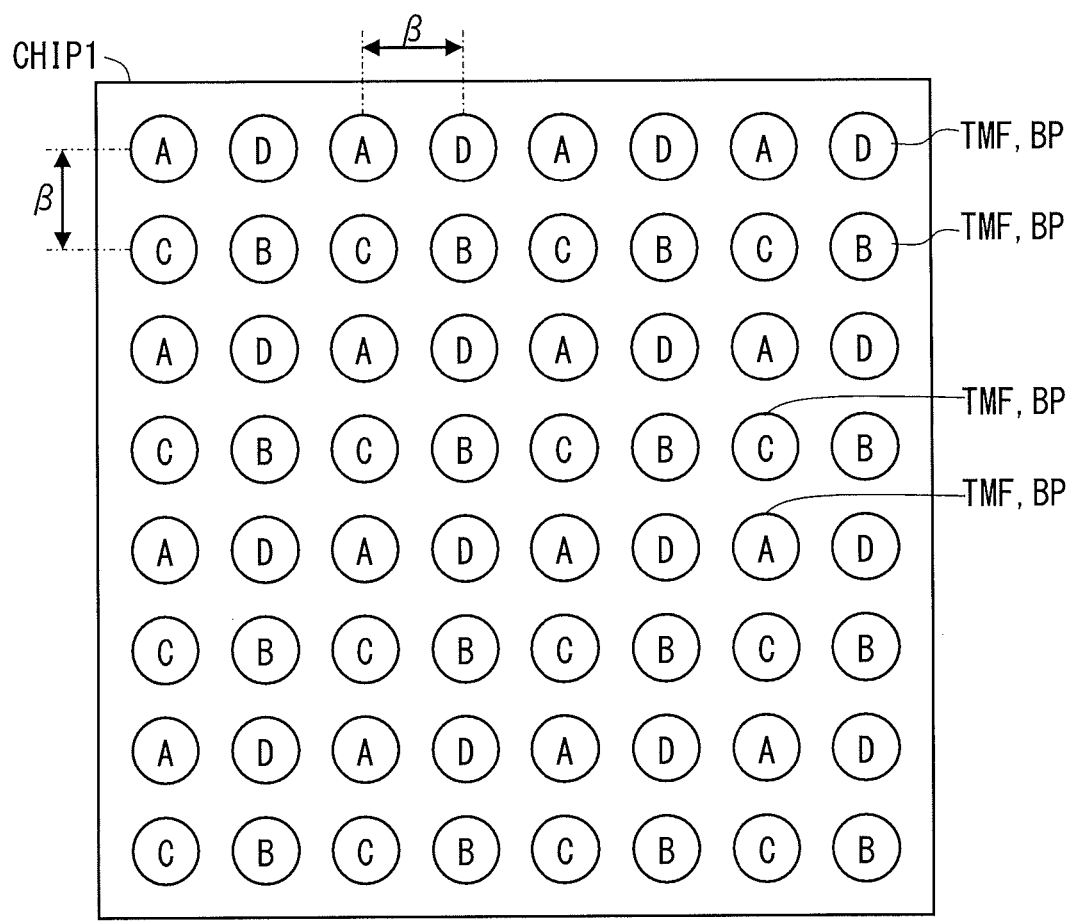
FIG. 9 is a view illustrating yet another example of the terminal arrangement of the semiconductor chip illustrated in FIG. 1.

FIG. 9 shows yet another example of the terminal arrangement of the semiconductor chip 1 illustrated in FIG. 1. Elements common to FIGS. 2 and 9 will carry the same reference characters, and the detailed description thereof will be omitted herein. For example, FIG. 9 illustrates the surface of the semiconductor chip 1. Meanwhile, the bumps BP connecting the terminals TMF to the terminals TMS of the semiconductor chip 2 are arranged equally or similarly to the arrangement of the terminals TMF. Further, the arrangement of the terminals TMS of the semiconductor chip 2 is equal or similar to an arrangement obtained by laterally reversing the terminal arrangement of FIG. 9, for example. In FIG. 9, reference characters A, B, C and D designate redundant groups A, B, C and D. That is, in the example of FIG. 9, the number of redundant groups is four. Meanwhile, the redundant groups may be five or more.

The terminals TMF are arranged on the surface of the semiconductor chip 1 such that an interval between neighboring terminals is equal to or larger than a predetermined interval β. Meanwhile, in each of the terminals TMF of the plurality of redundant groups A, B, C and D, a terminal TMF adjacent to each terminal TMF belongs to a group different from that of the latter terminal TMF.

For example, in one side of even-numbered and odd-numbered rows of the terminal arrangement illustrated in FIG. 9, the terminals TMF belonging to the redundant group A and the terminals TMF belonging to the redundant group D are alternately arranged in the lateral direction of FIG. 9. Further, in another side of the even-numbered and odd-numbered rows of the terminal arrangement, the terminals TMF belonging to the redundant group C and the terminals TMF belonging to the redundant group B are alternately arranged in the lateral direction of FIG. 9.

In this case, two adjacent terminals TMF in the oblique direction of FIG. 9 belong to different redundant groups. For example, the terminals TMF adjacent to the terminals TMF of the redundant group A in the oblique direction belong to the redundant group B. Further, the terminals TMF adjacent to the terminals TMF of the redundant group A in the longitudinal direction belong to the redundant group C. Further, the terminals TMF adjacent to the terminals TMF of the redundant group A in the lateral direction belong to the redundant group D.

Accordingly, the terminal arrangement of FIG. 9 may enhance the resistance to a failure caused by short-circuits between neighboring wirings, in comparison with the terminal arrangement of FIG. 2. For example, if the terminals TMF of the redundant group A and the terminals TMF of the redundant group B that are adjacent to the terminals TMF of the redundant group A in the oblique direction cause a short-circuit, the redundant circuit RDD does not use the terminals TMF that cause the short-circuit, in the redundant groups A and B. Therefore, the semiconductor device SEM may relieve a signal path.

Further, even if, for example, four adjacent terminals TMF (e.g., respective terminals TMF of the redundant groups A, B, C and D) cause short-circuits, the redundant circuit RDD does not use the terminals TMF that cause the short-circuit, in the redundant groups A, B, C and D. Therefore, the semiconductor device SEM may relieve a signal path. As such, the semiconductor device SEM may enhance the resistance to the failure caused by short-circuits between neighboring wirings, while suppressing an increase in circuit scale.

Meanwhile, the terminal arrangement of the semiconductor chip 1 is not limited to this arrangement. For example, the terminals TMF of the common wiring group or the terminals TMF of the third group may be arranged as illustrated in FIG. 7 or FIG. 8.

FIG. 10 shows still another example of the terminal arrangement of the semiconductor chip illustrated in FIG. 1. Elements common to FIGS. 2 and 10 will carry the same reference characters, and the detailed description thereof will be omitted herein. For example, FIG. 10 illustrates the surface of the semiconductor chip 1. Meanwhile, the bumps BP connecting the terminals TMF to the terminals TMS of the semiconductor chip 2 are arranged equally or similarly to the arrangement of the terminals TMF. Further, the arrangement of the terminals TMS of the semiconductor chip 2 is equal or similar to, for example, an arrangement obtained by laterally reversing the terminal arrangement of FIG. 10.

In FIG. 10, reference characters A, B, C, D, E, F and G designate redundant groups A, B, C, D, E, F and G. That is, in the example of FIG. 10, the number of redundant groups is seven. Meanwhile, the redundant groups may be eight or more. FIG. 10 mainly illustrates the arrangement of the terminals TMF belonging to the redundant group.

The terminals TMF are arranged in a zig-zag fashion such that intervals between them in both the lateral direction and the oblique direction are set to a predetermined interval β. In other words, the terminals TMF are arranged on the surface of the semiconductor chip 1 such that an interval between neighboring terminals is equal to or larger than the predetermined interval β. Meanwhile, in each of the terminals TMF of the plurality of redundant groups A, B, C, D, E, F and G, a terminal TMF adjacent to each terminal TMF belongs to a group different from that of the latter terminal TMF. Further, in respective terminals TMF of the plurality of redundant groups A, B, C, D, E, F and G, adjacent terminals TMF belong to different groups.

For example, six adjacent terminals TMF adjacent to the terminal TMF of the redundant group A belong to the redundant groups B, C, D, E, F and G, respectively. Accordingly, the terminal arrangement of FIG. 10 may enhance the resistance to the failure caused by short-circuits between neighboring wirings, in comparison with the terminal arrangement of FIG. 2 or 9. For example, if the terminal TMF of the redundant group A and the terminals TMF of the redundant groups B and G that are adjacent to the terminal TMF of the redundant group A in the lateral direction cause a short-circuit, the redundant circuit RDD does not use the terminals TMF that cause the short-circuit, in the redundant groups A, B and G. Therefore, the semiconductor device SEM may relieve a signal path.

Further, for example, if the terminal TMF of the redundant group A and six terminals TMF adjacent to the terminal TMF of the redundant group A cause a short-circuit, the redundant circuit RDD does not use the terminals TMF that cause the short-circuit, in the redundant groups A, B, C, D, E, F and G. Therefore, the semiconductor device SEM may relieve a signal path. As such, the semiconductor device SEM may enhance the resistance to the failure caused by short-circuits between neighboring wirings, while suppressing an increase in circuit scale.

Meanwhile, the terminal arrangement of the semiconductor chip 1 is not limited to this arrangement. For example, the terminals TMF of the common wiring group or the terminals TMF of the third group may be arranged as illustrated in FIG. 7 or 8.

As described above, in the semiconductor device and the testing method of the semiconductor device according to the embodiment illustrated in FIG. 1 to FIG. 10, the redundant circuit RDD selects the terminals TMF and TMS used to transmit data between the semiconductor chips 1 and 2 per redundant group. Meanwhile, the plurality of terminals TMF and TMS are arranged on a predetermined surface of each semiconductor chip such that an interval between neighboring terminals is equal to or larger than a predetermined value. Further, the plurality of terminals TMF and TMS are classified into a plurality of groups including a plurality of redundant groups to which the redundant terminals TMF and TMS belong. Further, in at least one of the plurality of redundant groups, terminals (e.g., terminals TMF or terminals TMS) belonging to the same redundant group are arranged at an interval that is larger than the predetermined interval.

Accordingly, this embodiment may decrease the probability that the terminals belonging to the same redundant group cause short-circuits, in comparison with an arrangement where terminals TMF belonging to the same redundant group are adjacently arranged at the predetermined interval, for example. Consequently, this embodiment may enhance the resistance to the failure caused by short-circuits between neighboring wirings, thus increasing the yield of the semiconductor device SEM.

For example, in the testing method of the semiconductor device SEM, the test circuit TCNT1 or the test circuit TCNT2 tests whether the signal path including the terminals TMF and TMS connected by the connecting portions such as the bumps BP has a failure. Further, if it is possible to evade a defective signal path, the redundant circuit RDD selects the terminals TMF and TMS used to transmit data between the semiconductor chips 1 and 2, based on the test result, per redundant group. Further, in this embodiment, the redundancy of the signal path including, for example, the terminals TMF and TMS is realized on a basis of redundant group, thus an increase in circuit scale of the redundant circuit RDD has been suppressed. That is, this embodiment may enhance the resistance to the failure caused by short-circuits between neighboring wirings, while suppressing an increase in circuit scale.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a illustrating of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a plurality of semiconductor chips; and
a connecting portion that connects a plurality of terminals formed on one of the plurality of semiconductor chips with a plurality of terminals formed on another of the plurality of semiconductor chips,
wherein the plurality of terminals of each of the plurality of semiconductor chips is classified into a first group and a second group such that each of the plurality of terminals of each of the plurality of semiconductor chips belongs to either one of the first group or the second group to be controlled independently,
terminals in the first and second groups are arranged such that terminals belonging to the first group and terminals belonging to the second group are alternately arranged in a lateral direction as well as a longitudinal direction, and an interval between two terminals of a same group is larger than a predetermined interval between terminals from each of the first and second groups adjacent with each other, and
each of the plurality of semiconductor chips includes a selecting portion that selects a signal transmitting terminal among the plurality of terminals per each of the first group and the second group such that the terminals in each of the first group and the second group are controlled independently by a different selecting portion.

2. The semiconductor device according to claim 1, wherein the plurality of terminals of each of the plurality of semiconductor chips is classified into the first group, the second group, and a third group each controlled with an independent control circuit such that each of the plurality of terminals of each of the plurality of semiconductor chips belongs to one of the first group, the second group, or the third group,
an interval between a third terminal of the third group and a second terminal of the second group adjacent to the third terminal is the predetermined interval, and
two third terminals of the third group adjacent with each other are arranged at an interval larger than the predetermined interval.

3. A method of testing a semiconductor device including a plurality of semiconductor chips and a connecting portion that connects a plurality of terminals formed on one of the plurality of semiconductor chips with a plurality of terminals formed on another of the plurality of semiconductor chips, the testing method comprising:
dividing the plurality of terminals of each of the plurality of semiconductor chips into a first group and a second group such that each of the plurality of terminals of each of the plurality of semiconductor chips belongs to either one of the first group and the second group to be controlled independently;
arranging the terminals in the first group and the second group such that terminals belonging to the first group and terminals belonging to the second group are alternately arranged in a lateral direction as well as a longitudinal direction, and an interval between two terminals of a same group is larger than a predetermined interval between terminals from each of the first and second groups adjacent with each other;
testing a signal path including terminals connected to each other by the connecting portion, using a testing device for testing the semiconductor device; and
selecting a signal transmitting terminal among the plurality of terminals per each of the first group and the second group such that the terminals in each of the first group and the second group are controlled independently from each other using a selecting portion included in each of the first group and the second group, based on a test result from the testing the signal path.

4. The method according to claim 3, wherein
the testing device selects the first group to be tested, and executes a first test of transmitting data of a first level and data of a second level different from the first level to a signal path corresponding to the first group to be tested and a signal path corresponding to the second group other than the first group to be tested, respectively, and a second test of transmitting the data of the second level and the data of the first level to the signal path corresponding to the first group to be tested and the signal path corresponding to second group other than the first group to be tested, respectively, and the selecting portion selects the signal transmitting terminal among the plurality of terminals per each of the first group and the second group, based on results of the first and second tests.

5. The semiconductor device according to claim 1, wherein the connecting portion is formed with a plurality of bumps.

\* \* \* \* \*